United States Patent
Iwashina et al.

(12) 
(10) Patent No.: US 12,294,034 B2
(45) Date of Patent: May 6, 2025

(54) LIGHT DETECTION DEVICE

(71) Applicant: HAMAMATSU PHOTONICS K.K., Hamamatsu (JP)

(72) Inventors: Shinya Iwashina, Hamamatsu (JP); Terumasa Nagano, Hamamatsu (JP); Masanori Okada, Hamamatsu (JP); Shunsuke Adachi, Hamamatsu (JP); Takuya Fujita, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/691,119

(22) PCT Filed: Aug. 10, 2022

(86) PCT No.: PCT/JP2022/030670
§ 371 (c)(1),
(2) Date: Mar. 12, 2024

(87) PCT Pub. No.: WO2023/042583
PCT Pub. Date: Mar. 23, 2023

(65) Prior Publication Data
US 2024/0387754 A1    Nov. 21, 2024

(30) Foreign Application Priority Data
Sep. 17, 2021 (JP) .................................. 2021-152232

(51) Int. Cl.
*H01L 31/02*     (2006.01)
*H01L 31/107*    (2006.01)

(52) U.S. Cl.
CPC ...... *H01L 31/02027* (2013.01); *H01L 31/107* (2013.01)

(58) Field of Classification Search
CPC . H01L 31/02027; H01L 31/107; H01L 31/10; G01J 1/00; G01J 1/02; G01J 1/42;
(Continued)

(56) References Cited

U.S. PATENT DOCUMENTS

2017/0363467 A1* 12/2017 Clemens ............. H01L 27/1446
2021/0176413 A1*  6/2021 Inoue ................ H01L 27/14612

FOREIGN PATENT DOCUMENTS

JP    2014-059301 A    4/2014
JP    2020-143959 A    9/2020
(Continued)

OTHER PUBLICATIONS

International Preliminary Report on Patentability mailed Mar. 28, 2024 for PCT/JP2022/030670.

*Primary Examiner* — Georgia Y Epps
*Assistant Examiner* — Don J Williams
(74) *Attorney, Agent, or Firm* — Faegre Drinker Biddle & Reath LLP

(57) ABSTRACT

In a light detection device, switches are connected in parallel to each other. Each of the switches is connected to an APD. A read line electrically connects the switch and a signal processor to each other. The switch is configured such that a second terminal is connected to the read line and a voltage greater than or equal to a breakdown voltage is applied to the APD in a conductive state. The switch is configured such that the second terminal is not connected to the read line and a voltage greater than or equal to a breakdown voltage is applied to the APD in the conductive state. The switch is configured such that the second terminal is not connected to the read line and a voltage less than a breakdown voltage is applied to the APD in the conductive state.

12 Claims, 15 Drawing Sheets

(58) Field of Classification Search
CPC .. H04B 10/60; H04N 5/30; G01S 7/48; G01C 3/00; G01C 3/32
See application file for complete search history.

(56) References Cited

FOREIGN PATENT DOCUMENTS

| | | |
|---|---|---|
| JP | 2021-090134 A | 6/2021 |
| JP | 2022-021822 A | 2/2022 |
| WO | WO-2022/070655 A1 | 4/2022 |

* cited by examiner

LIGHT DETECTION DEVICE

TECHNICAL FIELD

The present invention relates to a light detection device.

BACKGROUND ART

A light detection device equipped with an avalanche photodiode that operates in a Geiger mode has been known (for example, Patent Literature 1). In the Geiger mode, a voltage greater than or equal to a breakdown voltage is applied to the avalanche photodiode.

CITATION LIST

Patent Literature

Patent Literature 1: Japanese Unexamined Patent Publication No. 2014-059301

SUMMARY OF INVENTION

Technical Problem

An avalanche photodiode emits heat when light is incident thereon while a voltage greater than or equal to a breakdown voltage is applied thereto. Therefore, heat is emitted even when light other than detection light is incident thereon while a voltage greater than or equal to the breakdown voltage is applied to the avalanche photodiode. The amount of heat generated by the avalanche photodiode increases as an overvoltage increases. The overvoltage is a difference between a breakdown voltage and a reverse bias voltage applied to the avalanche photodiode configured to operate in the Geiger mode. As the number of avalanche photodiodes in the light detection device increases, the amount of heat generated in the light detection device increases. In a light detection device using an avalanche photodiode, there is concern that detection accuracy may decrease due to heat generation in the avalanche photodiode. Due to heat generated in the avalanche photodiode, there is concern that a lifespan during which reliability of a detection result of the light detection device is ensured may be shortened.

To suppress heat generation of the avalanche photodiode, it is conceivable to switch an operating state of the avalanche photodiode. For example, the operating state of the avalanche photodiode is switched by switching between a first state in which a voltage greater than or equal to the breakdown voltage is applied to the avalanche photodiode and a second state in which a voltage less than the breakdown voltage is applied to the avalanche photodiode. However, in this case, a recharge current flows in the avalanche photodiode when switching from the second state to the first state. The inventors of the present application have discovered that robustness of the light detection device is improved by inhibiting this recharge current from flowing to a signal processor that processes a signal of the avalanche photodiode.

An object of an aspect of the invention is to provide a light detection device, robustness of which can be improved.

Solution to Problem

A light detection device in one aspect of the invention includes at least one avalanche photodiode, at least one switch circuit, and a read line. The at least one avalanche photodiode forms a light receiving region and is configured to operate in a Geiger mode. The at least one switch circuit includes first, second, and third switches. The first, second, and third switches are connected in parallel to each other. The read line electrically connects the first switch and a signal processor to each other. The signal processor processes a signal from the avalanche photodiode. Each of the first, second, and third switches includes a first terminal and a second terminal different from the first terminal. The first terminal is connected to the avalanche photodiode. Each of the first, second, and third switches is configured to switch between a conductive state in which the first terminal and the second terminal are conductive and a cutoff state in which the first terminal and the second terminal are electrically cut off. The first switch is configured such that the second terminal is connected to the read line and a voltage greater than or equal to a breakdown voltage is applied to the avalanche photodiode in the conductive state. The second switch is configured such that the second terminal is not connected to the read line and a voltage greater than or equal to a breakdown voltage is applied to the avalanche photodiode in the conductive state. The third switch is configured such that the second terminal is not connected to the read line and a voltage less than a breakdown voltage is applied to the avalanche photodiode in the conductive state.

In the one aspect, when the first switch is set to the conductive state, a voltage greater than or equal to the breakdown voltage can be applied to the avalanche photodiode, and the second terminal of the avalanche photodiode can be connected to the read line. When the second switch is set to the conductive state, the second terminal of the avalanche photodiode is not connected to the read line, a voltage greater than or equal to a breakdown voltage is applied to the avalanche photodiode, and when the third switch is set to the conductive state, a voltage less than a breakdown voltage can be applied to the avalanche photodiode. As a result, when switching between a first state and a second state, it is possible to inhibit a recharge current from flowing into the read line. That is, in a configuration in which an operating state of the avalanche photodiode can be switched, a recharge current can be inhibited from flowing into the signal processor. Therefore, robustness of the light detection device can be improved.

In the one aspect, the light detection device may include a switch controller configured to perform a control operation of the first, second, and third switches. The switch controller may perform the control operation to set any one of the first, second, and third switches to the conductive state, and to set the other switches among the first, second, and third switches to the cutoff state. In this case, a flow is inhibited from flowing between mutually different switches.

In the one aspect, when switching from a state in which a detection signal is not allowed to be read from the avalanche photodiode to a state in which a detection signal is allowed to be read from the avalanche photodiode, the switch controller may perform the control operation so that the third switch, the second switch, and the first switch are in the conductive state in this order. In this case, a recharge current can be more reliably inhibited from flowing into the signal processor.

In the one aspect, when switching from a state in which a detection signal is not allowed to be read from the avalanche photodiode to a state in which a detection signal is allowed to be read from the avalanche photodiode, the switch controller may instruct the third switch to switch from the conductive state to the cutoff state, and then, after a predetermined time elapses, instruct the second switch to switch from the cutoff state to the conductive state. In this case, a current can be more reliably inhibited from flowing from the second terminal of the third switch to the second terminal of the second switch.

In the one aspect, when switching from a state in which a detection signal is not allowed to be read from the avalanche photodiode to a state in which a detection signal is allowed to be read from the avalanche photodiode, the switch controller may instruct the first switch to switch from the cutoff state to the conductive state at the same timing as instructing the second switch to switch from the conductive state to the cutoff state. In this case, the avalanche photodiode is inhibited from being in a floating state, and a voltage greater than or equal to the breakdown voltage can be stably applied to the avalanche photodiode.

In the one aspect, a potential applied to the second terminal of the second switch may be the same as a potential applied to the second terminal of the first switch. In this case, the avalanche photodiode can be connected to the read line in a stabler state.

In the one aspect, the light detection device may further include at least one first control line, at least one second control line, and at least one third control line. The at least one first control line may be configured to deliver a control signal to the first switch. The at least one second control line may be configured to deliver a control signal to the second switch. The at least one third control line may be configured to deliver a control signal to the third switch. The at least one avalanche photodiode may include a plurality of avalanche photodiodes. The at least one switch circuit may include a plurality of switch circuits. The plurality of switch circuits may each include the first switch, the second switch, and the third switch. The plurality of avalanche photodiodes may be included in a plurality of pixels. The plurality of pixels and the plurality of switch circuits may be included in a plurality of signal output units. The plurality of signal output units may each include a plurality of pixels and a plurality of switch circuits, and output signals from the pixels through the switch circuits. A plurality of first switches included in the same signal output unit may be connected to the same first control line. A plurality of second switches included in the same signal output unit may be connected to the same second control line. A plurality of third switches included in the same signal output unit may be connected to the same third control line. In this case, in the same signal output unit, operating states of a plurality of pixels connected to a plurality of MOS (Metal-oxide-Semiconductor) switch circuits can be switched at once.

In the one aspect, a plurality of first switches included in mutually different signal output units may be connected to mutually different first control lines. A plurality of second switches included in mutually different signal output units may be connected to mutually different second control lines. A plurality of third switches included in mutually different signal output units may be connected to mutually different third control lines. In this case, it is possible to switch operating states of a plurality of pixels connected to a plurality of MOS switch circuits at once for each signal output unit.

In the one aspect, the plurality of MOS switch circuits connected to the same first control line, the same second control line, and the same third control line may be arranged in a line. For each line, it is possible to switch operating states of a plurality of pixels connected to a plurality of MOS switch circuits at once.

In the one aspect, the plurality of MOS switch circuits may be arranged in a matrix. A plurality of MOS switch circuits included in mutually different signal output units and arranged in a line is connected to the same read line. In this case, the number of read lines and the number of signal processors can be reduced. A balance can be achieved between reducing the time required for signal processing and making the light detection device more compact.

In the one aspect, the light detection device may further include a plurality of signal processors configured to perform processes in parallel with each other in terms of time. The plurality of signal processors may be connected to mutually different read lines. In this case, a balance can be achieved between reducing the time required for signal processing and making the light detection device more compact.

A light detection device in another aspect of the invention includes at least one avalanche photodiode, first, second, and third switches, and a read line. The at least one avalanche photodiode forms a light receiving region and configured to operate in a Geiger mode. The first, second, and third switches are connected in parallel to each other. The first, second, and third switches are each connected to a terminal of the avalanche photodiode. The read line electrically connects the first switch and the signal processor to each other. The signal processor processes a signal from the avalanche photodiode. Each of the first, second, and third switches includes a first terminal and a second terminal different from the first terminal. The first terminal is connected to the avalanche photodiode. Each of the first, second, and third switches is configured to switch between a conductive state in which the first terminal and the second terminal are electrically conductive and a cutoff state in which the first terminal and the second terminal are electrically cut off. The second terminal of the first switch is connected to the read line. The second terminals of the second and third switches are not connected to the read line and are electrically separated from each other.

Advantageous Effects of Invention

An aspect of the invention can provide a light detection device, robustness of which can be improved.

DESCRIPTION OF EMBODIMENTS

Hereinafter, embodiments of the invention will be described in detail with reference to the accompanying drawings. Note that, in the description, the same elements or elements having the same function will be denoted by the same reference symbol, and a duplicate description will be omitted.

Figure 1:
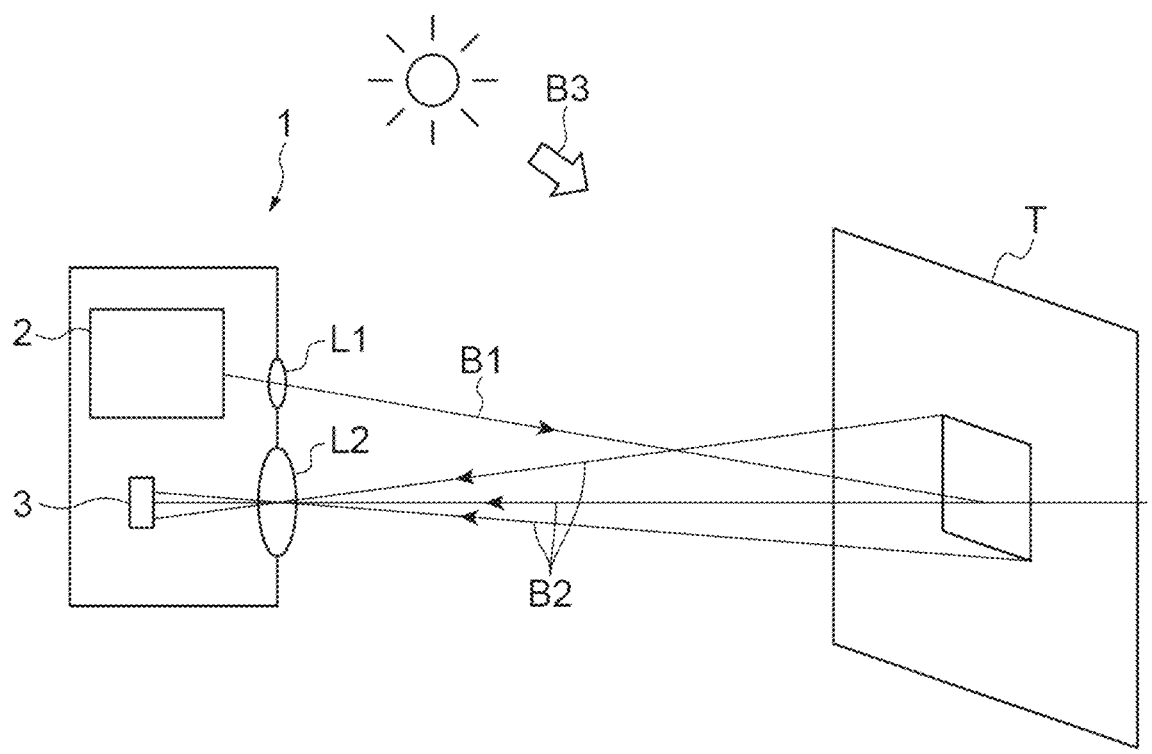
FIG. 1 is a schematic diagram illustrating a schematic configuration of a light detection device in this embodiment.
Figure 2:
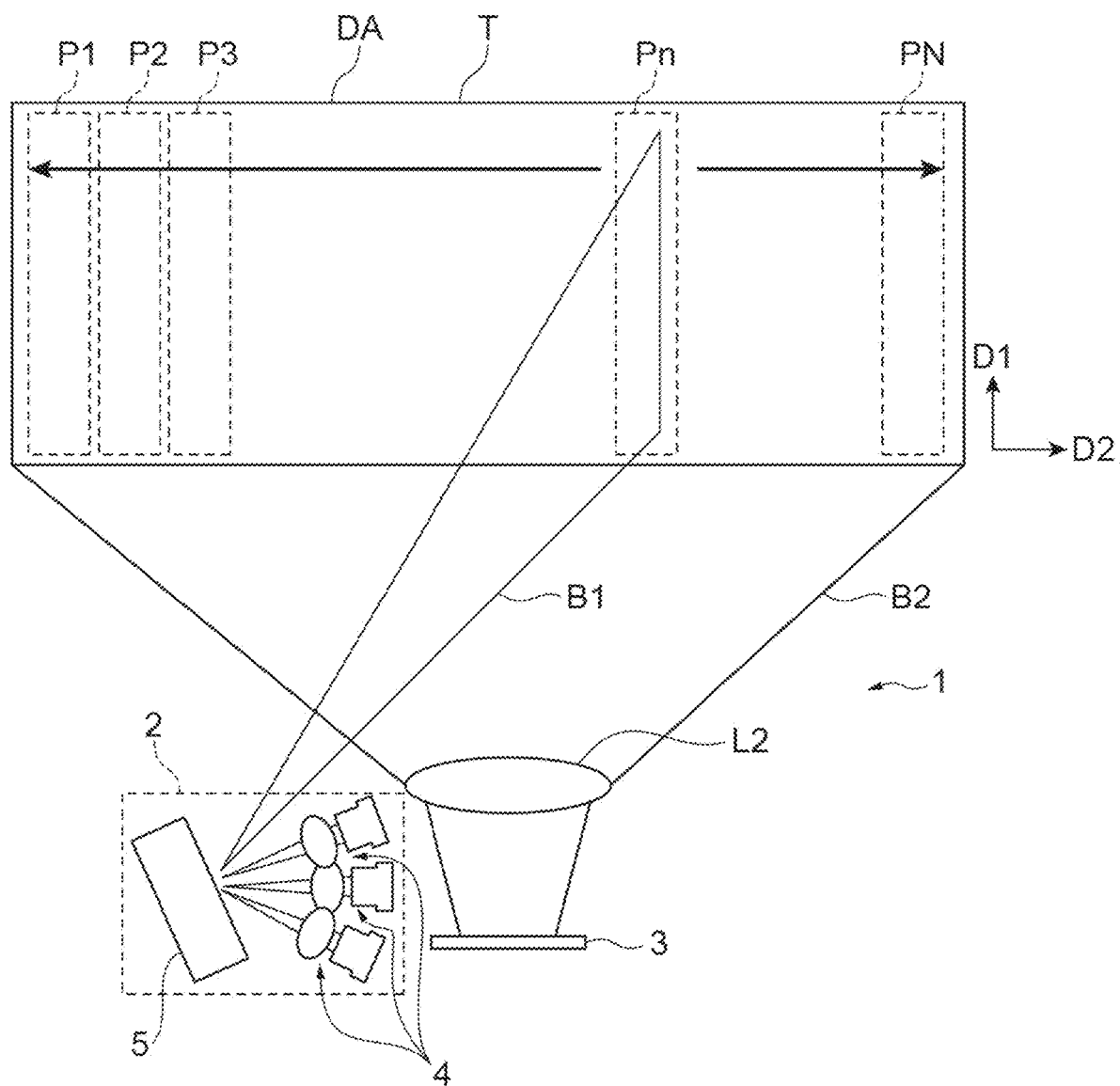
FIG. 2 is a schematic diagram illustrating a schematic configuration of the light detection device.

First, a configuration of a light detection device in this embodiment will be described with reference to FIGS. 1 and 2. FIGS. 1 and 2 are schematic diagrams illustrating schematic configurations of the light detection device in this embodiment.

The light detection device 1 detects incident light. For example, the light detection device 1 measures a distance to a measurement target by detecting light from the measurement target. The light detection device 1 is included in, for example, a LiDAR (Light Detection and Ranging). The light detection device 1 includes a light projection unit 2, a light reception unit 3, and lenses L1 and L2. The light projection unit 2 radiates a laser beam B1. The laser beam B1 emitted from the light projection unit 2 passes through the lens L1 and is radiated onto, for example, a target T. Light reflected from the target T passes through the lens L2 and is incident on the light reception unit 3 as measurement target light B2. The light reception unit 3 detects the incident measurement target light B2. In addition to the measurement target light B2, disturbance light B3 is incident on the light reception unit 3. The disturbance light B3 is, for example, environmental light such as sunlight.

As illustrated in FIG. 2, the light projection unit 2 radiates the laser beam B1 toward a detection target area DA. When the target T is present in the detection target area DA, the laser beam B1 radiated from the light projection unit 2 is reflected by the target T. The detection target area DA is arbitrarily set in advance, and has, for example, a rectangular shape.

The light projection unit 2 includes, for example, a plurality of laser light sources 4 and a mirror 5. The laser light sources 4 generate laser beams. The laser light sources 4 emit the generated laser beams toward the mirror 5. For example, each of the laser beams emitted from the plurality of laser light sources 4 is radiated onto the mirror 5. The mirror 5 reflects the plurality of laser beams emitted by the plurality of laser light sources 4 toward the detection target area DA as laser beams B1. Light reflected by the mirror 5 and radiated toward the detection target area DA has, for example, an elliptical shape in a plane perpendicular to a radiation direction. The light projection unit 2 radiates a laser beam having a cross-sectional shape in which a direction D1 is a longitudinal direction and a direction D2 is a transverse direction toward the detection target area DA. In other words, in the cross-sectional shape of the laser beam, the direction D1 is a long axis direction of an ellipse, and the direction D2 is a short axis direction of an ellipse or oval.

The cross-sectional shape of the laser beam may be a linear shape along the direction D1. The mirror 5 has a scanning unit that scans the laser beam in the light projection unit 2. The mirror 5 is, for example, a galvanometer mirror or MEMS mirror. For example, the scanning unit in the light projection unit 2 may be configured by a mechanism that changes a radiation direction of the laser beam B1 other than the mirror 5.

For example, the light projection unit 2 sequentially radiates the laser beams B1 toward respective radiation positions P1 to PN included in the detection target area DA from the radiation position P1 to the radiation position PN. N is an integer of 2 or more. By sequentially radiating the laser beams B1 from the radiation position P1 to the radiation position PN, the light projection unit 2 scans the laser beams along the direction D2. For example, by controlling an angle of the mirror 5, the laser beam B1 radiated toward one radiation position is radiated at different timing in order from a radiation position at an end of the detection target area DA along the direction D1.

The light projection unit 2 includes a controller (not illustrated). For example, the controller of the light projection unit 2 controls a radiation position of a laser beam radiated from the light projection unit 2 by driving and controlling the mirror 5. The controller of the light projection unit 2 transmits position information indicating one of the radiation positions P1 to PN and time information indicating a time to start radiation to a controller of the light reception unit 3.

Reflected light reflected at the detection target area DA is incident on the lens L2. The lens L2 condenses the incident reflected light so that the reflected light is incident on the light reception unit 3. The light reception unit 3 outputs a plurality of light reception signals according to the reflected light incident through the lens L2. In the light detection device 1, for example, a distance from the light detection device 1 to a portion present in a partitioned area of the target T is measured for each partitioned area based on the plurality of light reception signals. The partitioned area is an area obtained by dividing the detection target area DA into a plurality of partitions. Each of the radiation positions P1 to PN of the laser beams radiated from the light projection unit 2 is set, for example, in accordance with a position of the partitioned area.

Figure 3:
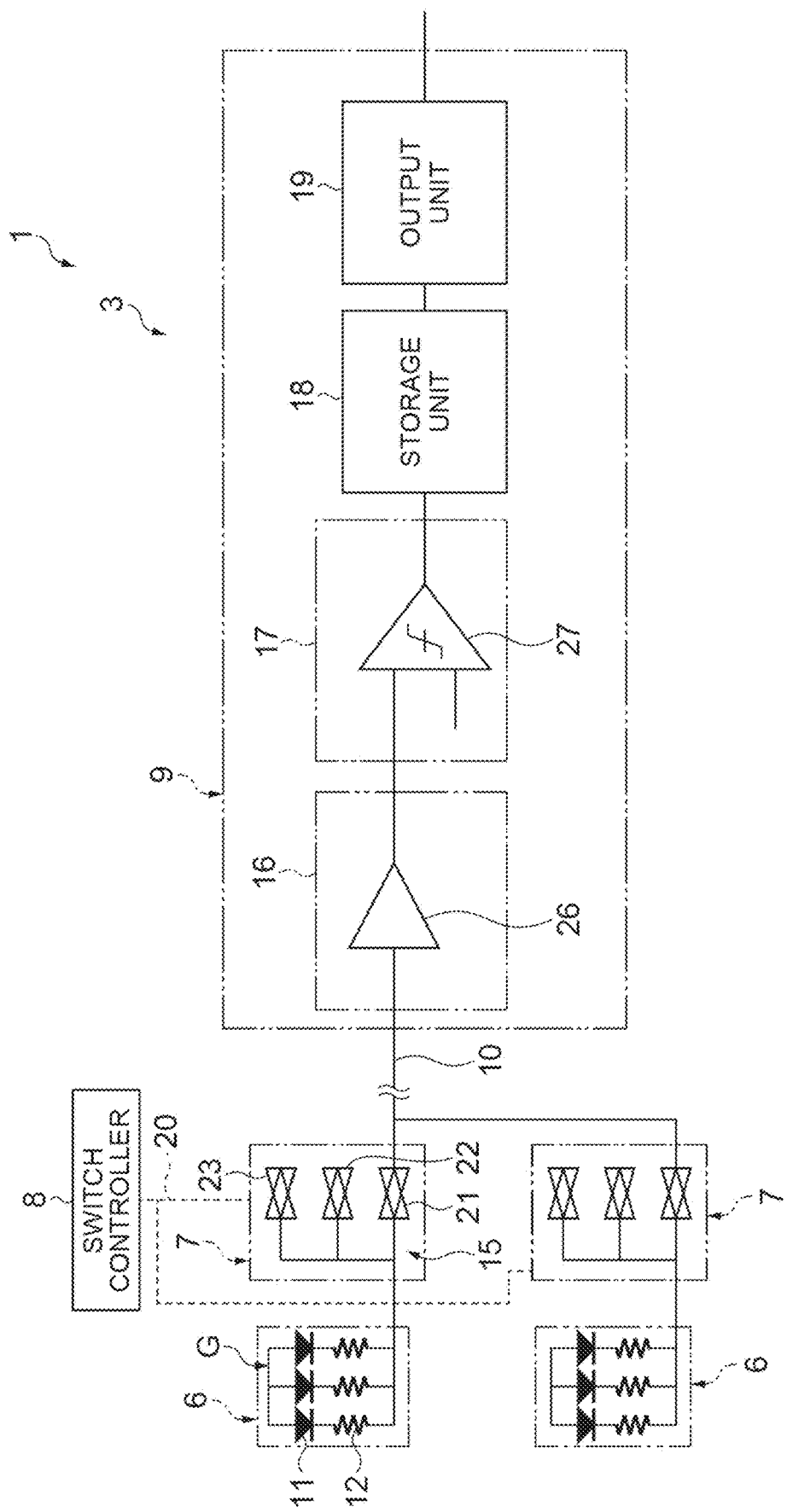
FIG. 3 is a block diagram of a light reception unit.

Next, a configuration of the light reception unit 3 included in the light detection device 1 will be described with reference to FIGS. 3 to 4. FIG. 3 is a block diagram of the light reception unit 3. As illustrated in FIG. 3, the light detection device 1 includes a light detector 6, a switch array 7, a switch controller 8, a signal processor 9, and a read line 10.

The light detector 6 outputs a detection signal in response to incidence of light. The light detector 6 includes a plurality of avalanche photodiodes 11 and quenching resistors 12. Hereinafter, "avalanche photodiode" will be referred to as "APD". For example, the light detector 6 includes a pixel G including a plurality of APDs 11. The light detector 6 includes a plurality of pixels G. Each of the pixels G includes a plurality of APDs 11. As illustrated in FIG. 4, each of the APDs 11 includes terminals 11a and 11b. For example, the terminal 11a is an anode and the terminal 11b is a cathode. In each pixel G, the plurality of APDs 11 is connected in parallel to each other. The plurality of APDs 11 forms one output end to which the terminal 11b of each APD 11 is connected. Each pixel G outputs a signal in response to incidence of light. The signal output from each pixel G is an analog signal based on incidence of light. In this specification, "connection" means electrical conduction even if not specified, and includes not only direct coupling but also indirect coupling through another member. "Connected" includes a configuration in which different elements are temporarily electrically separated by a switch, etc. separately provided between these elements.

Each APD 11 is an APD that operates in a Geiger mode. Each APD 11 multiplies electrons generated in response to incidence of light while a voltage greater than or equal to a breakdown voltage is applied. Each APD 11 outputs a signal based on the multiplied electrons to the signal processor 9 through the switch array 7.

The quenching resistors 12 quenches the APDs 11. For example, each of the quenching resistors 12 is connected in series to a terminal 11b of the corresponding APD 11 among the plurality of APDs 11. Each APD 11 is connected to the switch array 7 through the quenching resistor 12.

The switch array 7 switches potentials applied to the plurality of APDs 11 included in each pixel G. The switch array 7 switches between a state in which a detection signal from the pixel G of the light detector 6 can be read and a state in which the detection signal cannot be read. The switch array 7 transmits a signal output from the light detector 6 to the signal processor 9.

The switch array 7 includes, for example, a plurality of MOS (Metal-oxide-Semiconductor) switch circuits 15. Each of the MOS switch circuits 15 is connected to the read line 10. The MOS switch circuit 15 is electrically connected to a corresponding pixel G among the plurality of pixels G. The MOS switch circuit 15 switches an operating state of a pixel G electrically connected to the MOS switch circuit 15 among the plurality of pixels G. Hereinafter, the pixel G electrically connected to the MOS switch circuit 15 will also be simply referred to as the "corresponding pixel G." "Switching an operating state of a pixel" means switching between a state in which a detection signal from a corresponding pixel G can be read and a state in which the detection signal from the corresponding pixel G cannot be read.

A plurality of APDs 11 included in the same pixel G is connected to the same MOS switch circuit 15. A plurality of APDs 11 included in mutually different pixels G are connected to mutually different MOS switch circuits 15. In other words, the pixel G and the MOS switch circuit 15 are connected to each other in a one-to-one relationship. Output ends of the plurality of APDs 11 included in each pixel G are connected to the MOS switch circuit 15.

For a corresponding pixel G among the plurality of pixels G, the MOS switch circuit 15 switches between a state in which a detection signal can be read from the APD 11 included in this pixel G and a state in which a signal cannot be read out from the APD 11 included in this pixel G. For a corresponding pixel G among the plurality of pixels G, the MOS switch circuit 15 switches between a state in which a plurality of APDs 11 included in this pixel G breaks down and a state in which these APDs 11 do not break down. For a corresponding pixel G among the plurality of pixels G, the MOS switch circuit 15 switches an operating state of each of a plurality of APDs 11 included in this pixel G between a Geiger mode and a linear mode.

Each MOS switch circuit 15 includes a plurality of switches 21, 22, and 23. For example, each MOS switch circuit 15 includes three switches 21, 22, and 23. The switch 21 is a first switch. The switch 22 is a second switch. The switch 23 is a third switch. Each of the switches 21, 22, and 23 includes, for example, an MOS-FET (field effect transistor). The switches 21, 22, and 23 of each MOS switch circuit 15 are connected in parallel to each other. Each of the switches 21, 22, and 23 of each MOS switch circuit 15 is connected to the same corresponding pixel G among the plurality of pixels G. As illustrated in FIG. 4, each of the switches 21, 22, and 23 of each MOS switch circuit 15 is connected to the terminal 11b of the same corresponding APD 11 among the plurality of APDs 11. FIG. 4 is a diagram illustrating a configuration of the MOS switch circuit 15 connected to one pixel G.

Figure 4:
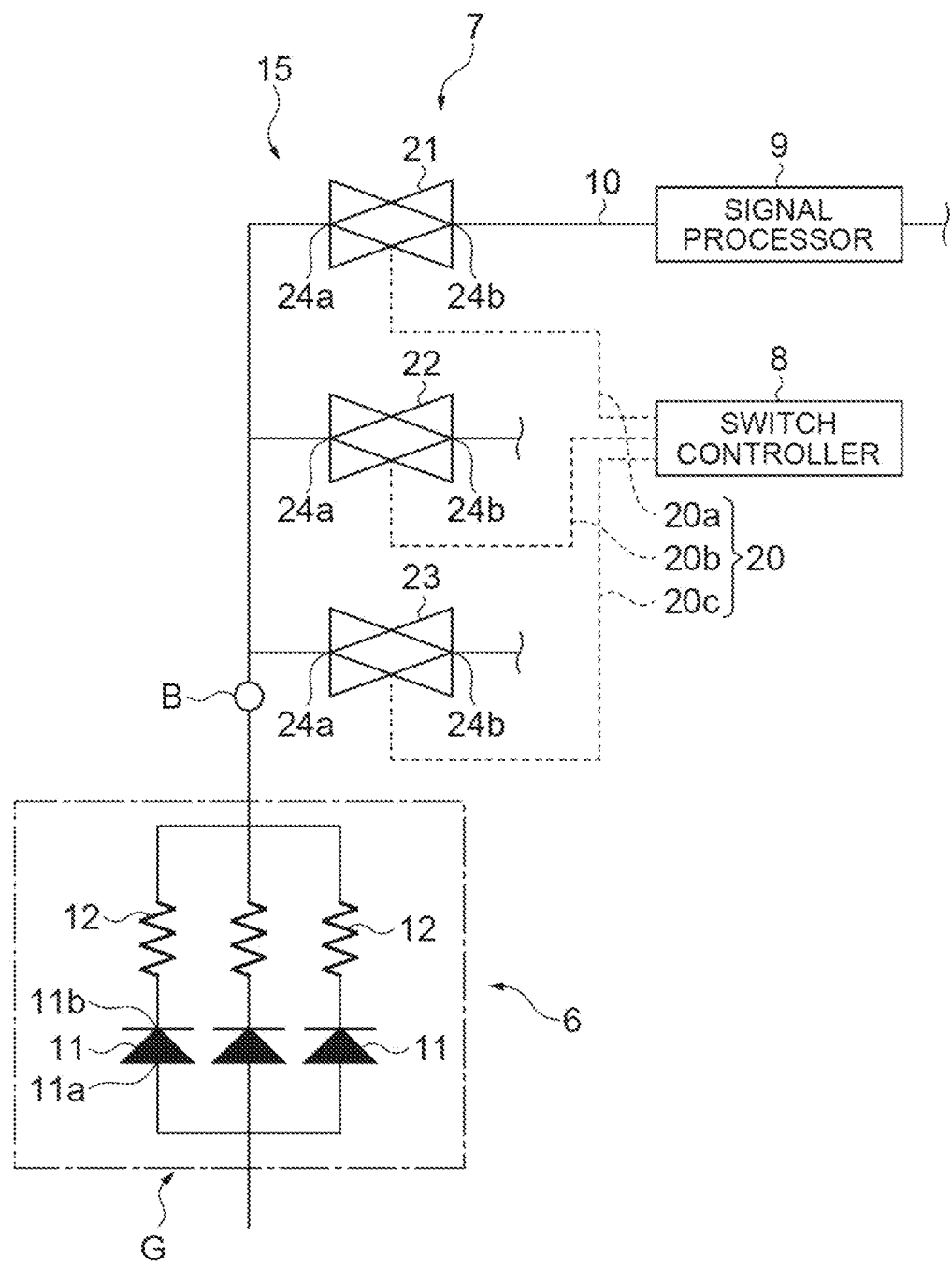
FIG. 4 is a diagram for describing a light detector and a switch array.

As illustrated in FIG. 4, each of the switches 21, 22, and 23 includes a terminal 24a and a terminal 24b different from each other. The terminal 24a is connected to the terminal 11b of the corresponding APD 11 among the plurality of APDs 11. The switches 21, 22, and 23 are each configured to switch between a conductive state in which the terminal 24a and the terminal 24b are electrically conductive and a cutoff state in which the terminal 24a and the terminal 24b are electrically cut off. When the terminal 24a corresponds to the first terminal, the terminal 24b corresponds to the second terminal.

The switch 21 is configured such that a voltage greater than or equal to the breakdown voltage is applied to the APD 11 connected to the switch 21 in the conductive state. The switch 21 is connected to the read line 10. The switch 21 is connected to the signal processor 9 through the read line 10. The switch 22 is configured such that a voltage greater than or equal to the breakdown voltage is applied to the APD 11 connected to the switch 22 in the conductive state.

For example, a voltage applied to the APD 11 connected to the switch 22 when the switch 22 is in the conductive state is the same as a voltage applied to the APD 11 connected to the switch 21 when the switch 21 is in the conductive state. For example, a potential applied to the terminal 24b of the switch 22 is the same as a potential applied to the terminal 24b of the switch 21. "Same" includes an error range due to noise, etc. As a modification of this embodiment, the voltage applied to the APD 11 connected to the switch 22 when the switch 22 is in the conductive state does not have to be the same as the voltage applied to the APD 11 connected to the switch 21 when the switch 21 is in the conductive state.

The switch 23 is configured such that a voltage less than the breakdown voltage is applied to the APD 11 connected to the switch 23 in the conductive state. The switch 22 and the switch 23 are not connected to the signal processor 9. The switch 22 and the switch 23 are connected to electrodes having fixed potentials. Details of the configuration of each of the switches 21, 22, and 23 will be described later.

The switch controller 8 controls the switch array 7. The switch controller 8 controls the switches 21, 22, and 23 of each MOS switch circuit 15. The switch controller 8 outputs a control signal that instructs the switch array 7 to switch states to the switch array 7. The switch array 7 switches the states of the switches 21, 22, and 23 of the MOS switch circuit 15 in response to the control signal from the switch controller 8.

For example, each MOS switch circuit 15 switches an operating state of a pixel G for the corresponding pixel G among the plurality of pixels G in response to a control signal from the switch controller 8. In other words, according to the control signal, each MOS switch circuit 15 switches between a state in which the pixel G corresponding to the MOS switch circuit 15 and the signal processor 9 are electrically conducted and a state in which the pixel G corresponding to the MOS switch circuit 15 and the signal processor 9 are electrically cut off. According to the control signal, each MOS switch circuit 15 switches potentials applied to the plurality of APDs 11 included in the pixel G corresponding to the MOS switch circuit 15. According to the control signal, each MOS switch circuit 15 switches between a state in which the plurality of APDs 11 included in the pixel G corresponding to the MOS switch circuit 15 breaks down and a state in which these APDs 11 do not break down.

The light detection device 1 further includes a control line 20 for transmitting a control signal from the switch controller 8 to the switch array 7. For example, the light detection device 1 includes a plurality of control lines 20. The plurality of control lines 20 transmits control signals to the plurality of MOS switch circuits, respectively. As illustrated in FIG. 4, the plurality of control lines 20 includes control lines 20a, 20b, and 20c. The control line 20a is connected to the switch 21 and transmits a control signal to the switch 21. The control line 20b is connected to the switch 22 and transmits a control signal to the switch 22. The control line 20c is connected to the switch 23 and transmits a control signal to the switch 23.

The signal processor 9 processes detection signals from the plurality of APDs 11 in the light detector 6. In this embodiment, one signal processor 9 is connected to a plurality of pixels G. The signal processor 9 sequentially processes signals from the plurality of pixels G in response to switching of the switch array 7 corresponding to each pixel G. The signal processor 9 processes a signal from the pixel G. The signal processor 9 includes a front-end circuit 16, a functional unit 17, a storage unit 18, and an output unit 19. The MOS switch circuit 15 and the front-end circuit 16 of the signal processor 9 are electrically connected through the read line 10 depending on the state of the MOS switch circuit 15. The signal processor 9 receives a signal from a corresponding pixel G among the plurality of pixels G through the read line 10 depending on the state of the MOS switch circuit 15. For example, the light detection device 1 includes a plurality of signal processors 9 performing processes in parallel with each other in terms of time.

The front-end circuit 16 performs various processes on a detection signal output from the light detector 6. The detection signal input from the light detector 6 to the front-end circuit 16 is an analog signal. The front-end circuit 16 includes, for example, a buffer amplifier 26. The buffer amplifier 26 removes noise from the detection signal.

The functional unit 17 outputs a signal indicating information on a detection signal. The functional unit 17 processes the detection signal and outputs a signal related to target information. For example, the functional unit 17 outputs a signal indicating information related to the amount of energy of light incident on the light detector 6 and a signal indicating information related to timing of incidence of light on the light detector 6 based on the detection signal. The functional unit 17 includes a comparator 27. The comparator 27 converts the detection signal from an analog signal to a digital signal. For example, comparator 27 is connected to the front-end circuit 16. For example, a detection signal output from the front-end circuit 16 is input to the comparator 27 without change. In other words, the functional unit 17 includes an electronic component after the comparator 27.

Figure 5:
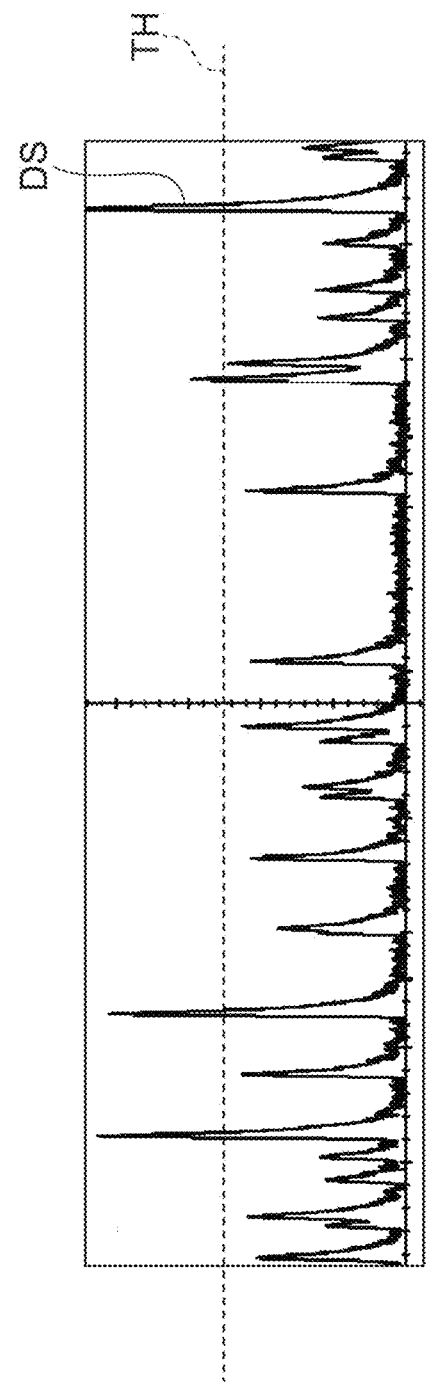
FIG. 5 is a diagram illustrating a detection signal detected by the light detection device.

For example, as illustrated in FIG. 5, the comparator 27 sets a threshold TH for a detection signal DS. As described above, since the plurality of APDs 11 of the light detection device 1 is connected in parallel for each pixel G, strength of the detection signal DS changes depending on incident light. By determining whether or not strength of the detection signal DS is greater than the threshold TH, it is possible to determine whether light incident on the pixel G is only the disturbance light B3. FIG. 5 is a diagram illustrating a detection signal detected by the light detection device 1.

The storage unit 18 stores a signal acquired from the functional unit 17. For example, the storage unit 18 stores information related to the amount of energy of light incident on the light detector 6 based on a signal output from the functional unit 17. The storage unit 18 stores information related to timing of light incidence on the light detector 6 based on a signal output from the functional unit 17.

The output unit 19 outputs information stored in the storage unit 18 to the outside. The output unit 19 outputs a signal indicating information stored by the storage unit 18 to the outside. The output unit 19 includes, for example, a serializer. The serializer generates a signal obtained by serializing information stored in the storage unit 18.

The read line 10 electrically connects the MOS switch circuit 15 and the front-end circuit 16 of the signal processor 9 to each other. The read line 10 electrically connects the terminal 24b of the switch 21 and the front-end circuit 16 of the signal processor 9 to each other. The read line 10 transmits a signal from a corresponding pixel G among the plurality of pixels G to the front-end circuit 16 of the signal processor 9 depending on the state of the MOS switch circuit 15.

Figure 6:
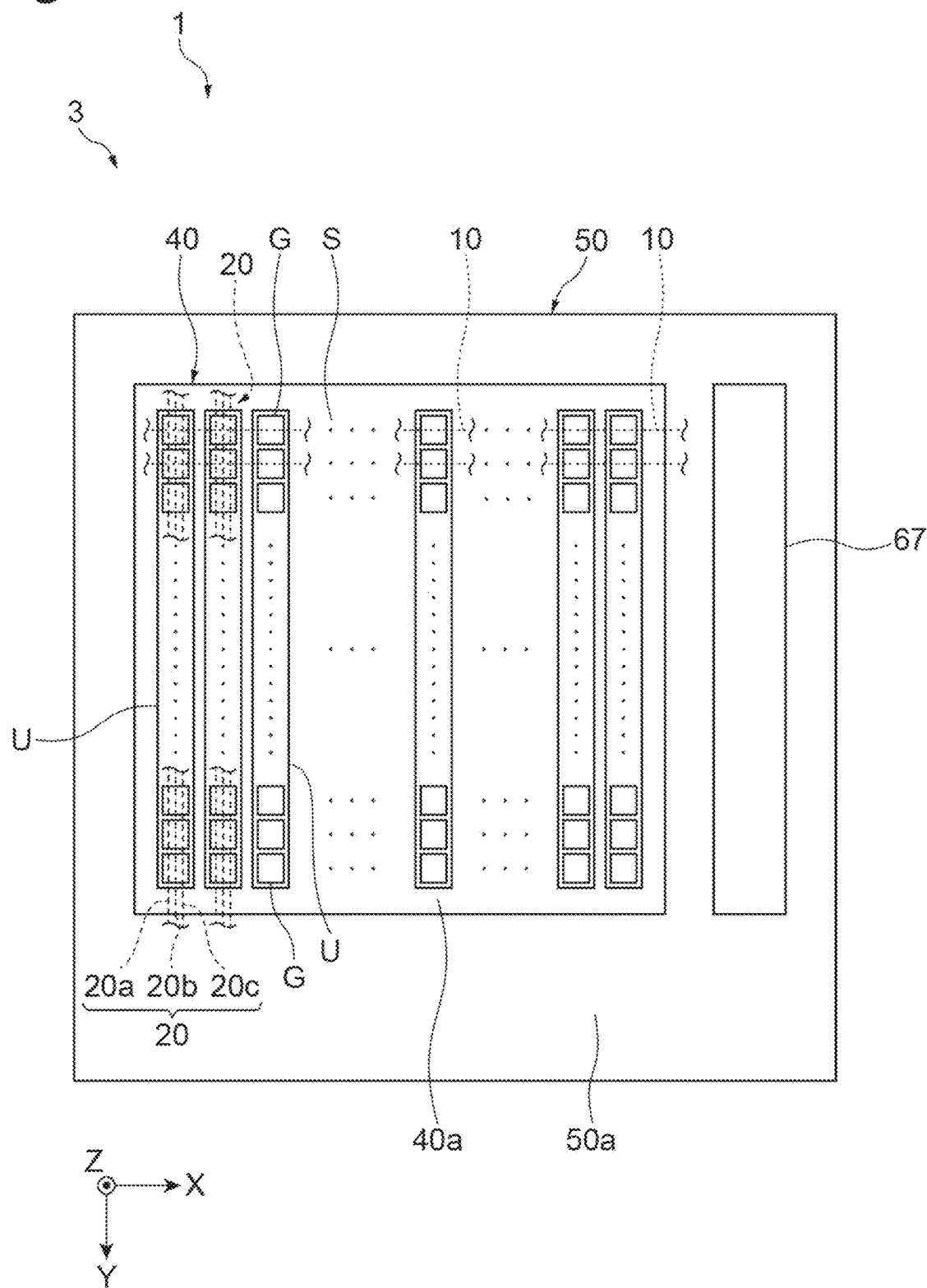
FIG. 6 is a schematic plan view of the light reception unit.
Figure 7:
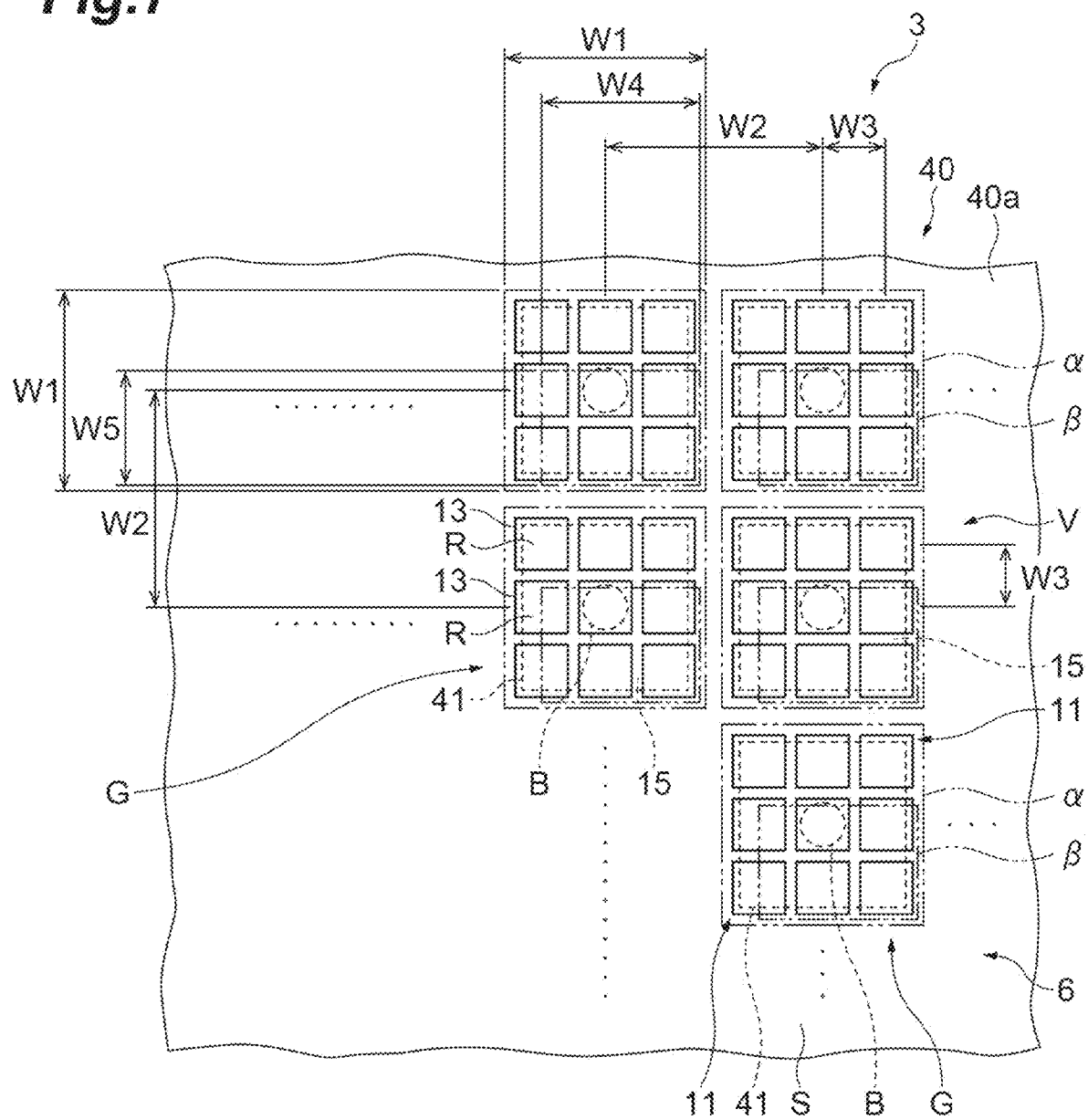
FIG. 7 is a partially enlarged view of the light reception unit.
Figure 8:
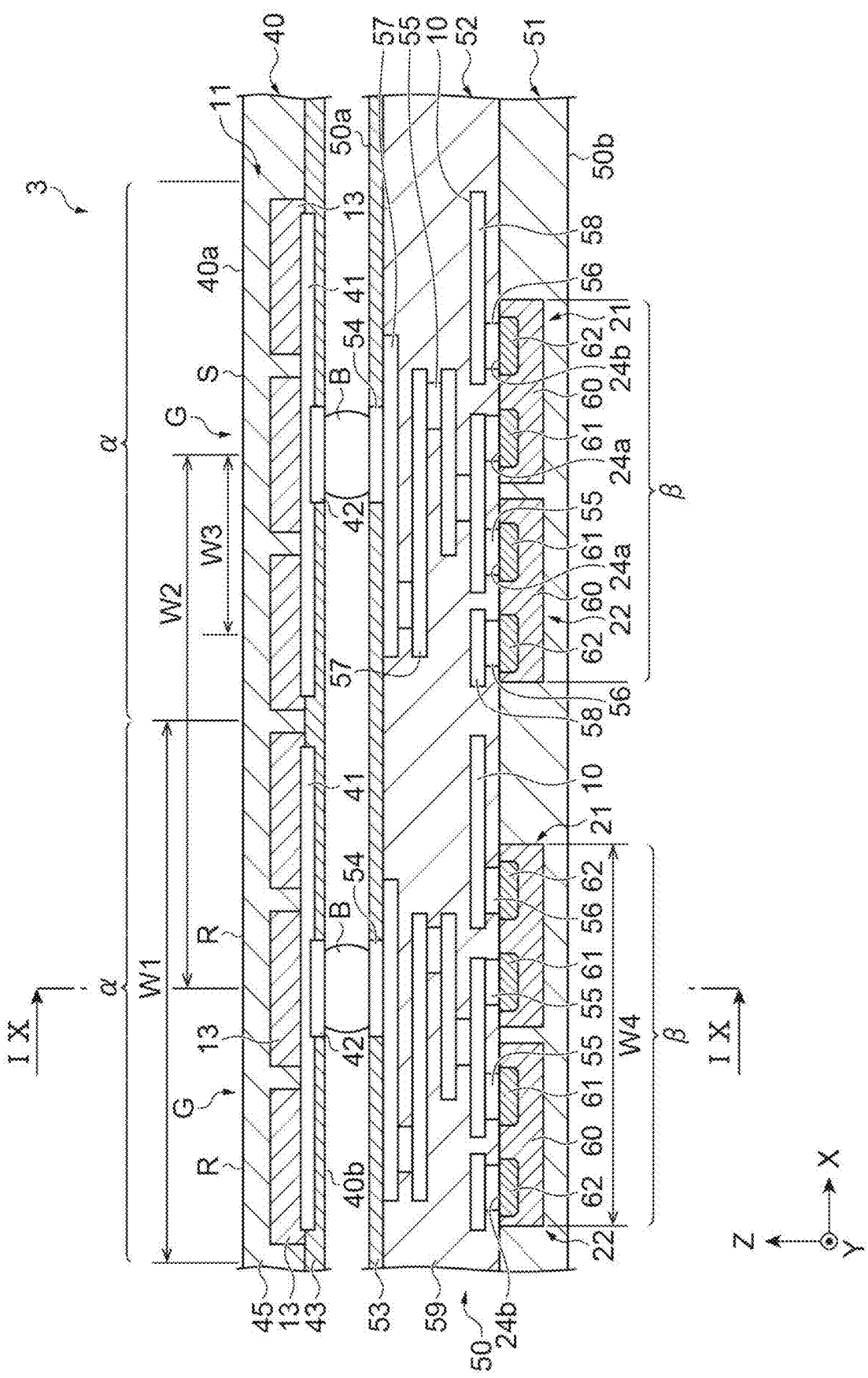
FIG. 8 is a cross-sectional view of the light reception unit.
Figure 9:
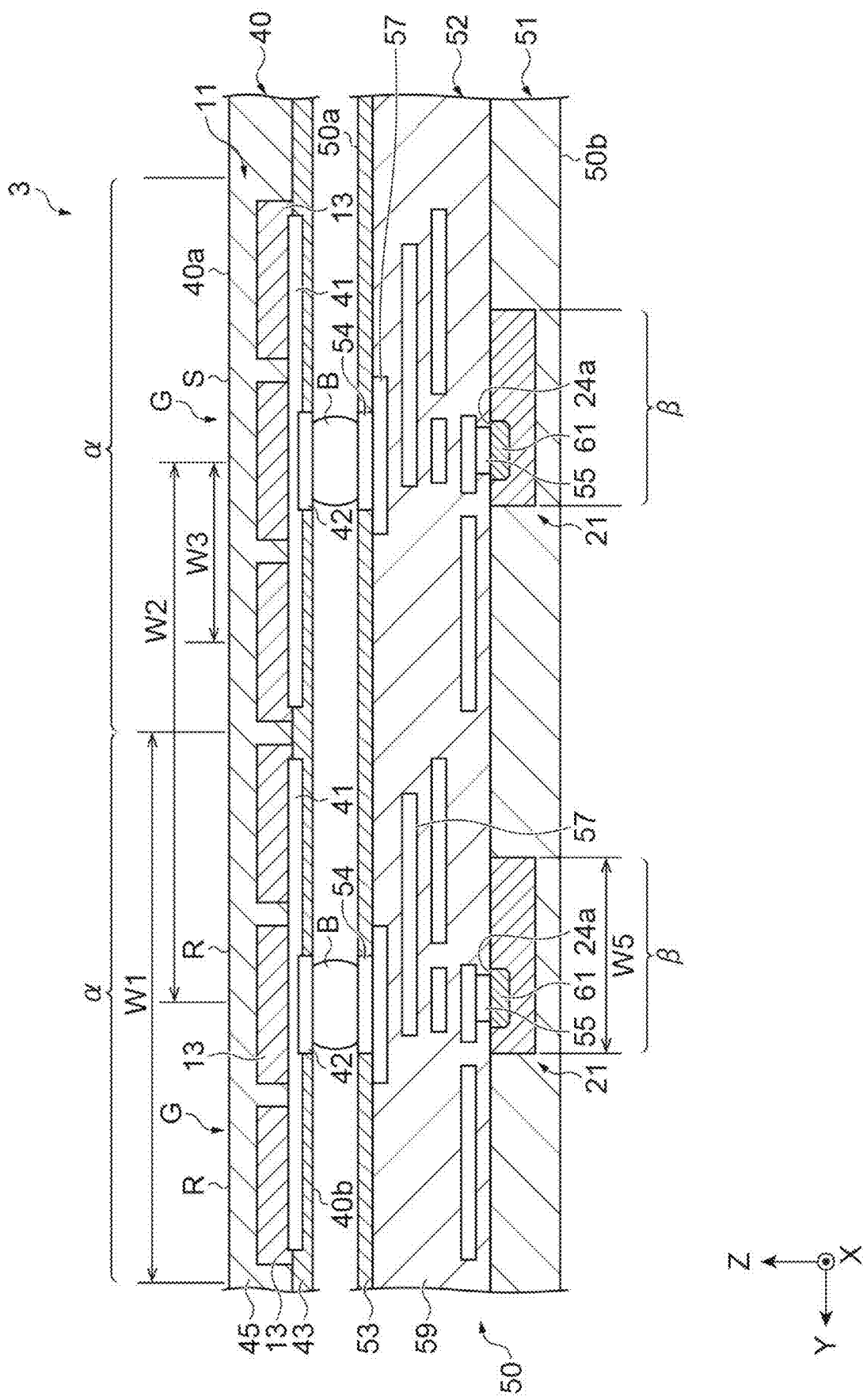
FIG. 9 is a cross-sectional view of the light reception unit taken along line IX-IX of FIG. 8.

FIG. 6 is a schematic plan view of the light reception unit 3. FIG. 7 is a partially enlarged view of the light reception unit 3. FIG. 8 is a cross-sectional view of the light reception unit 3. FIG. 9 is a cross-sectional view of the light reception unit 3 taken along line IX-IX of FIG. 8. In configurations illustrated in FIGS. 7 and 8, the light reception unit 3 is a back-illuminated semiconductor light detection device.

As illustrated in FIGS. 6 and 7, the light reception unit 3 includes a light detection board 40 and a circuit board 50. Each of the light detection board 40 and the circuit board 50 has, for example, a rectangular shape extending in XY-axis directions when viewed from a Z-axis direction. The light detection board 40 and the circuit board 50 are connected to each other. An X-axis, a Y-axis, and a Z-axis intersect with each other. In this embodiment, the X-axis, the Y-axis, and the Z-axis are orthogonal to each other.

The light reception unit 3 has an incident surface S on which detection light is incident. The light detection board 40 includes a main surface 40a corresponding to the incident surface S. The main surface 40a extends along an X-axis direction and a Y-axis direction. The main surface 40a is perpendicular to the Z-axis direction. The incident surface S is, for example, parallel to an XY-axis plane. A direction perpendicular to the incident surface S corresponds to the Z-axis direction. The light detection board 40 and the circuit board 50 include a plurality of signal output units U. The plurality of signal output units U is arranged in a direction along the incident surface S. The plurality of signal output units U each have, for example, a rectangular shape extending in the Y-axis direction, and is arranged parallel to each other in a line in the X direction. The Y-axis direction coincides with the direction D1 of FIG. 2. The X-axis direction coincides with the direction D2 of FIG. 2. For example, the plurality of signal output units U is two-dimensionally arranged in one row and 32 columns when viewed from the Z-axis direction. In a modification of this embodiment, the plurality of signal output units U may be arranged in the Y-axis direction. The plurality of signal output units U may be two-dimensionally arranged in a matrix.

Each of the signal output units U includes a plurality of pixels G and a plurality of MOS switch circuits 15. Each signal output unit U outputs a signal from a pixel G through an MOS switch circuit 15. The plurality of pixels G is arranged at regular intervals. The plurality of pixels G is arranged in at least one of the X-axis direction and the Y-axis direction.

In a configuration illustrated in FIG. 6, in each signal output unit U, the plurality of pixels G is arranged in a line in the Y-axis direction. For example, the plurality of pixels G is two-dimensionally arranged in 32 rows and 1 column in each signal output unit U when viewed from the Z-axis direction. In a modification of this embodiment, in each of the plurality of signal output units U, a plurality of pixels G may be arranged in the X-axis direction. The plurality of pixels G may be two-dimensionally arranged in a matrix in each signal output unit U. In other words, each signal output unit U may include a plurality of pixel columns arranged in the X-axis direction. In this case, in each pixel column, a plurality of pixels G is arranged in the Y-axis direction.

In this embodiment, the light reception unit 3 performs light detection at different timing for each signal output unit U. For example, a plurality of pixels G included in one signal output unit U performs light detection at the same timing. As a modification of this embodiment, the light reception unit 3 may perform light detection at different timing for each of a plurality of arbitrarily combined signal output units U. In this modification, for example, a plurality of pixels G included in a plurality of combined signal output units U performs light detection at the same timing. The light reception unit 3 may perform light detection at the same timing in all signal output units U.

Each signal output unit U includes at least the light detector 6 and the switch array 7. As illustrated in FIGS. 6 and 7, the plurality of pixels G is two-dimensionally arranged in a matrix when viewed from the Z-axis direction. As illustrated in FIG. 7, the plurality of MOS switch circuits 15 is two-dimensionally arranged in a matrix when viewed from the Z-axis direction. In the light reception unit 3, each pixel G and an MOS switch circuit 15 corresponding to the pixel G are arranged in one rectangular area when viewed from the Z-axis direction. When viewed from the Z-axis direction, sets of mutually corresponding pixels G and MOS switch circuits 15 are two-dimensionally arranged in the XY-axis directions in the light reception unit 3.

Each pixel G is provided in a pixel area α. In FIGS. 6 and 7, mutually adjacent pixel areas α are illustrated to be spaced apart from each other for easy understanding. However, in practice, the mutually adjacent pixel areas α may be in contact with each other. The pixel area α is an area occupied by the pixel G when viewed from the Z-axis direction. The pixel area α is an area occupied by a plurality of APDs 11 included in the pixel G when viewed from the Z-axis direction. The pixel area α is defined by edges of a plurality of APDs 11 located on an outer periphery among all APDs 11 included in each pixel G when viewed from the Z-axis direction.

The circuit board 50 includes the read line 10 and the control line 20 described above. The read line 10 transmits detection signals from a plurality of connected pixels G to the signal processor 9. The control line 20 transmits a control signal from the switch controller 8 to the switch array 7.

For example, as illustrated in FIG. 6, the circuit board 50 includes a plurality of read lines 10 extending in the X-axis direction. Each read line 10 electrically connects a corresponding MOS switch circuit 15 among the plurality of MOS switch circuits 15 and the signal processor 9. Each read line 10 is electrically connected to a plurality of pixels G of mutually different signal output units U. Each read line 10 is connected to a plurality of MOS switch circuits 15 corresponding to a plurality of pixels G arranged in the X-axis direction. A plurality of MOS switch circuits 15 included in mutually different signal output units U and arranged in a line is connected to the same read line 10. In other words, the plurality of MOS switch circuits 15 arranged in the X-axis direction is connected to the same read line 10. The plurality of signal processors 9 is connected to different read lines 10.

Each read line 10 is connected to a terminal 24b of a switch 21 corresponding to a plurality of pixels G arranged in the X-axis direction. When a plurality of signal output units U is arranged in one row and 32 columns, each read line 10 is electrically connected to 32 pixels G. The light detection device 1 includes a plurality of signal processors 9 connected to corresponding read lines 10 among the plurality of read lines 10. The read lines 10 and the signal processors 9 are connected in a one-to-one relationship. When a plurality of pixels G is two-dimensionally arranged in 32 rows and one column in each signal output unit U, the light detection device 1 includes 32 read lines 10 and 32 signal processors 9.

For example, as illustrated in FIG. 6, the circuit board 50 includes a plurality of control lines 20 extending along an arrangement direction of the plurality of pixels G in each signal output unit U. A plurality of MOS switch circuits 15 included in the same signal output unit U is connected to the same control line 20. A plurality of MOS switch circuits 15 included in mutually different signal output units U is connected to mutually different control lines 20. The plurality of MOS switch circuits 15 connected to the same control line 20 is arranged in a line. A plurality of MOS switch circuits 15 connected to the same control line 20a, the same control line 20b, and the same control line 20c is arranged in a line.

For example, as illustrated in FIG. 6, the plurality of control lines 20 includes three control lines 20a, 20b, and 20c for each signal output unit U. The control line 20a is connected to a plurality of switches 21 in each signal output unit U, and transmits a control signal to each switch 21. The control line 20b is connected to a plurality of switches 22 in each signal output unit U and transmits a control signal to each switch 22. The control line 20c is connected to a plurality of switches 23 in each signal output unit U, and transmits a control signal to each switch 23. The control line 20a corresponds to a first control line. The control line 20b corresponds to a second control line. The control line 20c corresponds to a third control line.

For example, a plurality of switches 21 included in the same signal output unit U is connected to the same control line 20a. A plurality of switches 22 included in the same signal output unit U is connected to the same control line 20b. A plurality of switches 23 included in the same signal output unit U is connected to the same control line 20c.

For example, each of the control lines 20a, 20b, and 20c extends in the Y-axis direction. Each of the control lines 20a, 20b, and 20c is connected to a plurality of MOS switch circuits 15 corresponding to a plurality of pixels G arranged in the Y-axis direction. The control line 20a is connected to control terminals of a plurality of switches 21 corresponding to a plurality of pixels G arranged in the Y-axis direction. The control line 20b is connected to control terminals of a plurality of switches 22 corresponding to a plurality of pixels G arranged in the Y-axis direction. The control line 20c is connected to control terminals of a plurality of switches 23 corresponding to a plurality of pixels G arranged in the Y-axis direction.

For example, by switching the states of the switches 21, 22, and 23 using the switch controller 8, detection signals from a plurality of pixels G are output to a plurality of signal processors 9 through a plurality of read lines 10 for each column. The plurality of signal processors 9 processes detection signals acquired through the plurality of read lines 10 in parallel. In other words, detection signals from a plurality of pixels G included in the same signal output unit U are processed in parallel in terms of time in a plurality of signal processors 9. The plurality of signal processors 9 processes signals for each signal output unit U.

As illustrated in FIG. 7, each APD 11 includes an active area 13. The active area 13 is a semiconductor layer of a second conductivity type surrounded by a semiconductor region of a first conductivity type on a main surface of a semiconductor substrate included in the light detection board 40. The active area 13 is defined by a semiconductor region of the first conductivity type. The active area 13 is formed by doping with impurities. The first conductivity type is, for example, N-type, and the second conductivity type is, for example, P-type. As a modification of this embodiment, the first conductivity type may be P-type and the second conductivity type may be N-type.

For example, each pixel G includes a plurality of two-dimensionally arranged active areas 13. In the configuration illustrated in FIG. 7, each active area 13 has a square shape when viewed from the Z-axis direction. Each active area 13 may have a circular or rectangular shape when viewed from the Z-axis direction. In the configuration illustrated in FIG. 7, each pixel G includes active areas 13 arranged in a square matrix when viewed from the Z-axis direction. As a modification of this embodiment, each pixel G may include a plurality of active areas 13 arranged in a line.

When viewed from the Z-axis direction, for example, the area of each active area 13 is 2 $\mu m^2$ or more and 640 $\mu m^2$ or less. The "area of an active area" means the projected area of the active area. The "projected area" means the area of a shadow of a target assumed to be formed on a surface perpendicular to a predetermined direction on the assumption that only the target is taken out and this target is illuminated with light parallel to the predetermined direction. For example, the projected area of the active area 13 viewed in the Z-axis direction is the area of a shadow of the active area 13 assumed to be formed on a surface perpendicular to the Z-axis direction on the assumption that only the active area 13 is taken out and the active area 13 is illuminated with light parallel to the Z-axis direction.

An edge of the APD 11 is determined by a position of the active area 13. For example, the edge of the APD 11 is located equidistant from edges of mutually adjacent active areas 13 when viewed from the Z-axis direction. For example, an edge of an APD 11 located at an endmost position is located away from an edge of an active area 13 by half a distance between the edges of the mutually adjacent active areas 13 when viewed from the Z-axis direction.

Each pixel G includes a plurality of light receiving regions R. Each of the plurality of APDs 11 forms a light receiving region R. The light receiving region R is a region on which detection light can be incident in a depletion layer extending from an active area 13 of an APD 11 forming the light receiving region R when the APD 11 is in operation. Therefore, when the incident surface is limited by a light shielding member, the light receiving region R is narrower than the depletion layer. In other words, the light receiving region R of each APD 11 is a region where detection light detected by the APD 11 is converted into electrons and holes. In other words, the light receiving region R of each APD 11 is a region where incident light can be detected in each APD 11. The light reception unit 3 detects light incident on each light receiving region R. For example, each pixel G includes a plurality of two-dimensionally arranged light receiving regions R. Each light receiving region R is located corresponding to each active area 13. For example, each light receiving region R coincides with a region defined by the edge of the APD 11 described above when viewed from the Z-axis direction. When viewed from the Z-axis direction, the area of each light receiving region R is, for example, 5 $m^2$ or more and 650 $\mu m^2$ or less. The "area of the light receiving region of each APD" means the projected area of the light receiving region of each APD. In this embodiment, the area of the light receiving region R of each APD 11 is greater than the area of each active area 13.

In the configuration illustrated in FIG. 7, each pixel area α has a square shape when viewed from the Z-axis direction. Each pixel area α may have a rectangular shape when viewed from the Z-axis direction. In the pixel area α, a width W1 in the Y-axis direction may be greater than a width W1 in the X-axis direction. In this case, for example, the width W1 in the Y-axis direction may be a maximum width of the pixel area α, and the width W1 in the X-axis direction may be a minimum width of pixel area α.

The plurality of pixels G is arranged at a certain pitch W2 in at least one of the X-axis direction and the Y-axis direction. A minimum pitch of the pixels G is, for example, greater than twice a maximum width of the light receiving region R when viewed from the Z-axis direction. In this specification, a "pitch of a pixel" means a distance between centers of mutually adjacent pixels when viewed from the Z-axis direction. A "center of a pixel" means a geometric center of a pixel when viewed from the Z-axis direction. The "maximum width of the light receiving region when viewed from the Z-axis direction" means a value of a longest width of the light receiving region when viewed from the Z-axis direction.

For example, the plurality of pixels G is arranged at the same pitch W2 in the X-axis direction and the Y-axis direction. For example, the plurality of pixels G may be arranged at different pitches W2 in the X-axis direction and the Y-axis direction. For example, the pitch W2 in the Y-axis direction may be less than the pitch W2 in the X-axis direction. In this case, for example, the pitch W2 in the Y-axis direction may be a minimum pitch of the pixels G, and the pitch W2 in the X-axis direction may be a maximum pitch of the pixels.

The APDs 11 included in each pixel G are arranged at a certain pitch W3 in at least one of the X-axis direction and the Y-axis direction. In this specification, "a pitch of APDs" means a distance between centers of mutually adjacent APDs when viewed from the Z-axis direction. A "center of an APD" means a geometric center of an APD when viewed from the Z-axis direction. The center of the APD 11 is, for example, a geometric center of the active area 13 when viewed from the Z-axis direction. The center of the APD 11 may be, for example, a geometric center of the light receiving region R when viewed from the Z-axis direction.

The plurality of APDs 11 is arranged, for example, at the same pitch W3 in the X-axis direction and the Y-axis direction. As a modification of this embodiment, for example, the plurality of APDs 11 may be arranged at mutually different pitches W3 in the X-axis direction and the Y-axis direction. For example, the pitch W3 in the Y-axis direction may be less than the pitch W3 in the X-axis direction. In this case, for example, the pitch W3 in the Y-axis direction may be a minimum pitch of the APDs 11, and the pitch W3 in the X-axis direction may be a maximum pitch of the pixels.

Each MOS switch circuit 15 is provided in a MOS switch circuit region β. The MOS switch circuit region β is a region occupied by the MOS switch circuit 15. In other words, the MOS switch circuit region β is a region occupied by the plurality of switches 21, 22, and 23 included in the MOS switch circuit 15 when viewed from the Z-axis direction. The MOS switch circuit region β is defined by edges of a plurality of switches 21, 22, and 23 located on an outer periphery among all switches 21, 22, and 23 included in each MOS switch circuit 15 when viewed from the Z-axis direction. The edges of the switches 21, 22, and 23 are edges of wells included in the respective switches.

The MOS switch circuit region β has, for example, a rectangular shape. The MOS switch circuit region β may have a square shape or a circular shape. For example, a maximum width W4 of the MOS switch circuit region β is less than the maximum width W1 of the pixel area α. For example, a minimum width W5 of the MOS switch circuit region β is less than the minimum width W1 of the pixel area α. For example, a maximum width W4 of the MOS switch circuit region β is less than a minimum pitch W2 of the pixels G. For example, a minimum width W5 of the MOS switch circuit region β is less than a minimum pitch W2 of the pixels G. When viewed from the Z-axis direction, the area of each MOS switch circuit region β is, for example, 1000 μm$^2$ or more. For example, each of the switches 21, 22, and 23 included in each MOS switch circuit region β has a withstand voltage greater than 3.3 V. The "area of an MOS switch circuit region" means the projected area of the MOS switch circuit region.

The MOS switch circuit region β overlaps with a pixel area α occupied by a pixel G corresponding to an MOS switch circuit 15 of this MOS switch circuit region β when viewed from the Z-axis direction. In this specification, "overlapping" includes the case where at least a portion overlaps, and may include a non-overlapping part. For example, the MOS switch circuit region β is located within the pixel area α of the corresponding pixel G among the plurality of pixels G when viewed from the Z-axis direction.

Viewed from the Z-axis direction, the area of the MOS switch circuit region β is greater than the area of one light receiving region R formed in a pixel area α overlapping with this MOS switch circuit region β. The MOS switch circuit region β overlaps with a plurality of light receiving regions R formed in the pixel area α overlapping with the MOS switch circuit region β when viewed from the Z-axis direction. Therefore, when viewed from the Z-axis direction, the area of the MOS switch circuit region β is greater than the area of one active area 13 formed in the pixel area α overlapping with this MOS switch circuit region β. The MOS switch circuit region β overlaps with a plurality of active areas 13 formed in the pixel area α overlapping with this MOS switch circuit region β when viewed from the Z-axis direction.

Viewed from the Z-axis direction, the area of the MOS switch circuit region β is less than or equal to the area of the pixel area. The "area of a pixel area" means the projected area of the pixel area. For example, when viewed from the Z-axis direction, the area of the MOS switch circuit region β is less than the area of the pixel area α overlapping with this MOS switch circuit region β.

For example, when viewed from the Z-axis direction, the total area of a plurality of switches 21, 22, and 23 included in one MOS switch circuit 15 is greater than the area of a light receiving region R of one APD 11 connected to this MOS switch circuit 15. The "area of a switch" means the projected area of the switch. For example, when viewed from the Z-axis direction, the total area of a plurality of switches 21, 22, and 23 included in one MOS switch circuit 15 is less than the area of a pixel area α overlapping with an MOS switch circuit region β occupied by this MOS switch circuit 15.

When viewed from the Z-axis direction, the area of the MOS switch circuit region β is greater than a value obtained by squaring a pitch W3 of a plurality of APDs 11 included in a pixel G overlapping with this MOS switch circuit region β. The "value obtained by squaring the pitch W3 of the APDs 11" corresponds to the area of a square, a side of which is the pitch W3. As a modification of this embodiment, when a plurality of APDs 11 included in a pixel G is arranged at mutually different pitches W3 in the X-axis direction and the Y-axis direction, the "value obtained by squaring the pitch W3" corresponds to a value obtained by squaring the greater pitch W3 among the pitch W3 in the Y-axis direction and the pitch W3 in the X-axis direction.

As a modification of this embodiment, when a plurality of APDs 11 included in a pixel G is arranged at mutually different pitches W3 in the X-axis direction and the Y-axis direction, the area of the MOS switch circuit region β may be greater than a value obtained by multiplying the pitch W3 in the Y-axis direction by the pitch W3 in the X-axis direction. The "value obtained by multiplying the pitch W3 in the Y-axis direction by the pitch W3 in the X-axis direction" corresponds to the area of a rectangle, a long side and a short side of which are the pitch W3 in the Y-axis direction and the pitch W3 in the X-axis direction, for a plurality of APDs 11 included in a pixel G overlapping with an MOS switch circuit region β to be compared.

In configurations illustrated in FIGS. 8 and 9, the light reception unit 3 further includes a plurality of bump electrodes B disposed between the light detection board 40 and the circuit board 50. The light detection board 40 and the circuit board 50 are physically and electrically connected by the plurality of bump electrodes B. For example, a direction in which the light detection board 40 and the circuit board 50 face each other corresponds to the Z-axis direction. Each of the bump electrodes B is connected to a corresponding pixel G among the plurality of pixels G. The plurality of bump electrodes B and the plurality of pixels G are connected to each other in a one-to-one relationship. A bump electrode B electrically connects a plurality of APDs 11 included in a pixel G corresponding to the bump electrode B to the MOS switch circuit 15. For example, when viewed from the Z-axis direction, the bump electrode B is disposed in a light receiving region R of one of a plurality of APDs 11 included in a pixel G corresponding to the bump electrode B. For example, the bump electrode B is disposed in a pixel area α of a pixel G corresponding to the bump electrode B when viewed from the Z-axis direction. In other words, in this embodiment, the light receiving region R and pixel area α are larger than the bump electrode B when viewed from the Z-axis direction. As a modification of this embodiment, the light receiving region R may be smaller than the bump electrode B when viewed from the Z-axis direction.

The light detection board 40 further includes, for example, a main surface 40b that faces the above-mentioned main surface 40a. For example, the main surface 40a and the main surface 40b are parallel to the XY-axis plane. The plurality of pixels G is arranged in a direction along the main surface 40a. The plurality of APDs 11 forms a plurality of light receiving regions R arranged in the direction along the main surface 40a in a pixel area α occupied by a corresponding pixel G among the plurality of pixels G. Light incident on the main surface 40a is guided to the light receiving region R.

The light detection board 40 includes the light detector 6 described above. The light detection board 40 includes a semiconductor substrate 45 having a rectangular shape in a plan view. The semiconductor substrate 45 is made of a compound semiconductor. The semiconductor substrate 45 contains at least one selected from Si, InP, InGaASP, InGaAS, GaAS, InGaAS, AlGaAS, and InAlGaAS. The semiconductor substrate 45 is, for example, an N-type semiconductor substrate. As a modification of this embodiment, the semiconductor substrate 45 may be, for example, a P-type semiconductor substrate.

The semiconductor substrate 45 includes a plurality of APDs 11. For example, the plurality of APDs 11 is two-dimensionally arranged in the XY-axis directions on the semiconductor substrate 45. In the configurations illustrated in FIGS. 8 and 9, each APD 11 includes an active area 13 on the main surface 40b side. The active area 13 is formed, for example, by doping the semiconductor substrate 45 with impurities from the main surface 40b side. The active area 13 is, for example, P-type.

The plurality of APDs 11 included in each pixel G is electrically connected to each other in parallel. The terminal 11b of each APD 11 is connected to the circuit board 50 through the bump electrode B. Each APD 11 outputs a detection signal to the circuit board 50 in response to incidence of light on the light receiving region R while a voltage greater than or equal to the breakdown voltage is applied.

The light detection board 40 further includes an electrode layer 41, an electrode pad 42, and a passivation layer 43. A plurality of APDs 11 included in the same pixel G is connected to the electrode layer 41 on the main surface 40b side of the semiconductor substrate 45. The main surface 40b side of the semiconductor substrate 45 is covered with the electrode layer 41 and the passivation layer 43. A plurality of APDs 11 included in each of the plurality of pixels G is connected in parallel to each other by the electrode layer 41. The electrode pad 42 is connected to the electrode layer 41. The electrode layer 41 is covered with the passivation layer 43 except for a portion where the electrode pad 42 is provided. At least a part of the electrode pad 42 is exposed from the passivation layer 43. The passivation layer 43 is, for example, an insulating layer. The passivation layer 43 includes, for example, a silicon oxide film.

The electrode pad 42 is connected to the bump electrode B at a portion exposed from the passivation layer 43. The plurality of APDs 11 included in each pixel G is connected to one corresponding bump electrode B through the electrode layer 41 and the electrode pad 42. A plurality of APDs 11 included in the same pixel G is connected to the same bump electrode B through the same electrode layer 41 and the same electrode pad 42. Each of a plurality of APDs 11 included in mutually different pixels G is connected to one of mutually different bump electrodes B through mutually different electrode layers 41 and mutually different electrode pads 42. In other words, the pixel G and the bump electrode B are connected in a one-to-one relationship.

The circuit board 50 has, for example, a main surface 50a and a main surface 50b facing each other. The circuit board 50 has a rectangular shape in a plan view. The light detection board 40 is connected to the circuit board 50. The main surface 50a and the main surface 40b face each other. A surface parallel to each of the main surfaces of the light detection board 40 and the circuit board 50 corresponds to the XY-axis plane, and a direction perpendicular to each main surface corresponds to the Z-axis direction.

The circuit board 50 includes the switch array 7, the switch controller 8, and the signal processor 9 described above. At least the switch array 7 is disposed in a region defined by an edge of the light detection board 40 when viewed from the Z-axis direction. At least the switch array 7 is disposed in a region overlapping the main surface 40a when viewed from the Z-axis direction. As a modification of this embodiment, the signal processor 9 may be included in a board configured separately from the light detection board 40 and the circuit board 50. In this modification, the board including the signal processor 9 and the circuit board 50 may be electrically connected to each other by wire bonding.

Some or all of the switch array 7, the switch controller 8, and the signal processor 9 are each configured by an integrated circuit. This integrated circuit includes, for example, an ASIC (Application Specific Integrated Circuit) or an FPGA (Field Programmable Gate Array). The circuit board 50 includes this hardware and software such as a program.

The switch array 7 includes the plurality of MOS switch circuits 15 as described above. The plurality of MOS switch circuits 15 is arranged in the direction along the incident surface S. The plurality of MOS switch circuits 15 is electrically connected to corresponding pixels G, respectively. Each APD 11 forming the light receiving region R is connected to a corresponding MOS switch circuit 15 among the plurality of MOS switch circuits 15. For example, a plurality of APDs 11 included in the same pixel G is connected to the same MOS switch circuit 15 through the same bump electrode B. For example, a plurality of APDs 11 included in mutually different pixels G is connected to mutually different MOS switch circuits 15 through mutually different bump electrodes B. Each MOS switch circuit 15 includes the plurality of switches 21, 22, and 23. In FIGS. 8 and 9, the switch array 7 of the circuit board 50 is illustrated. In FIGS. 8 and 9, only the switch 21 and the switch 22 are illustrated.

As illustrated in FIGS. 8 and 9, the circuit board 50 includes a silicon substrate 51, a wiring layer 52 stacked on the silicon substrate 51, and a passivation layer 53 stacked on the wiring layer 52. The switch array 7 includes the silicon substrate 51 and the wiring layer 52. The silicon substrate 51 includes a plurality of wells 60 forming a plurality of MOS switch circuits 15. A drain 61 and a source 62 are formed in each well 60. The wiring layer 52 includes a plurality of electrode pads 54, a plurality of vias 55 and 56, a plurality of metal layers 57 and 58 disposed in different layers, and an insulating layer 59. The wiring layer 52 further includes gates (not illustrated) forming a plurality of MOS switch circuits 15. The wiring layer 52 further includes a plurality of read lines 10.

The wiring layer 52 is covered with the passivation layer 53 except for a portion where the electrode pad 54 is provided. At least a part of the electrode pad 54 is exposed from the passivation layer 53. The passivation layer 53 is, for example, an insulating layer. The passivation layer 53 is, for example, a silicon oxide film.

The electrode pad 54 is formed for each MOS switch circuit 15 on the main surface 50a side, and is connected to the electrode pad 42 of the light detection board 40 through the bump electrode B. The plurality of electrode pads 54 is two-dimensionally arranged on the main surface 50a side. Each electrode pad 54 is disposed to overlap with a pixel G connected through the bump electrode B.

The plurality of vias 55 is formed to penetrate the insulating layer 59 and connects the electrode pad 54, the plurality of metal layers 57, and the terminals 24a of the switches 21, 22, and 23. The plurality of vias 56 is formed to penetrate the insulating layer 59 and connects the metal layer 58 and the terminals 24b of the switches 21, 22, and 23. An n-type MOS transistor or a p-type MOS transistor is used for the MOS switch circuit 15.

For example, the electrode pad 54 is connected to a cathode of the APD 11. A p-type MOS transistor is used for the MOS switch circuit 15. In this case, the drain 61 corresponds to the terminals 24a of the switches 21, 22, and 23, and the source 62 corresponds to the terminals 24b of the switches 21, 22, and 23. In this case, the plurality of vias 55 is formed to penetrate the insulating layer 59 and connects the electrode pad 54, the plurality of metal layers 57, and the drain 61. Therefore, each pixel G is connected to a corresponding one of the plurality of drains 61 through the electrode pad 42, the bump electrode B, the electrode pad 54, the plurality of vias 55, and the plurality of metal layers 57. Each pixel G is connected to the drain 61 of the MOS switch circuit 15 corresponding to the pixel G. The plurality of vias 56 is formed to penetrate the insulating layer 59 and connects the metal layer 58 and the source 62. The metal layer 58 is connected to a source 62 of a corresponding switch among the switches 21, 22, and 23 through a via 56.

The terminal 24b of the switch 21 is connected to a corresponding one of the plurality of read lines 10 through the metal layer 58 and the via 56. The terminals 24b of the switches 22 and 23 are not connected to the read line 10. The terminals 24b of the switches 21, 22, and 23 are electrically separated from each other. In other words, the terminals 24b of the switches 21, 22, and 23 are insulated from each other. The terminal 24b of the switch 22 and the terminal 24b of the switch 23 are connected to different electrodes (not illustrated), respectively, through the metal layer 58. For example, the terminals 24b of the switches 22 connected to a plurality of pixels G of the light detection device 1 is connected to a common electrode through the metal layer 58. For example, the terminals 24b of the switches 23 connected to a plurality of pixels G of the light detection device 1 is connected to a common electrode through the metal layer 58.

In the configurations illustrated in FIGS. 8 and 9, the read line 10 electrically connects the source 62, which is connected through the metal layer 58 and the via 56, to the front-end circuit 16 of the signal processor 9. For example, by applying a potential greater than or equal to a threshold to a gate of the MOS switch circuit 15, the signal processor 9 receives a signal from the pixel G connected to the MOS switch circuit 15 through the read line 10.

As illustrated in FIG. 6, the circuit board 50 further includes a port 67. The port 67 includes a plurality of electrodes. A power supply (not illustrated) is connected to the port 67. A voltage from the power supply is applied to the port 67. The power supply may be included in the light reception unit 3 or may be provided outside the light reception unit 3. The light detection board 40 and the circuit board 50 operate according to voltages applied to the port 67. Each APD 11 and each of the switch 21, 22, and 23 are operated by voltages applied to the port 67. The circuit board 50 outputs a signal processed by the signal processor 9 to the outside of the circuit board 50 from the port 67. In this embodiment, ports 67 are aggregated into one area. The incident surface S and the port 67 are arranged in the X-axis direction. For example, when the incident surface S has a rectangular shape, the port 67 may be arranged along one side of the incident surface S. As a modification of this embodiment, the ports 67 may be provided in a plurality of areas spaced apart from each other. In this modification, when the incident surface S has a rectangular shape, the ports 67 may be arranged along each of two sides, three sides, or four sides of the incident surface S.

Figure 10:
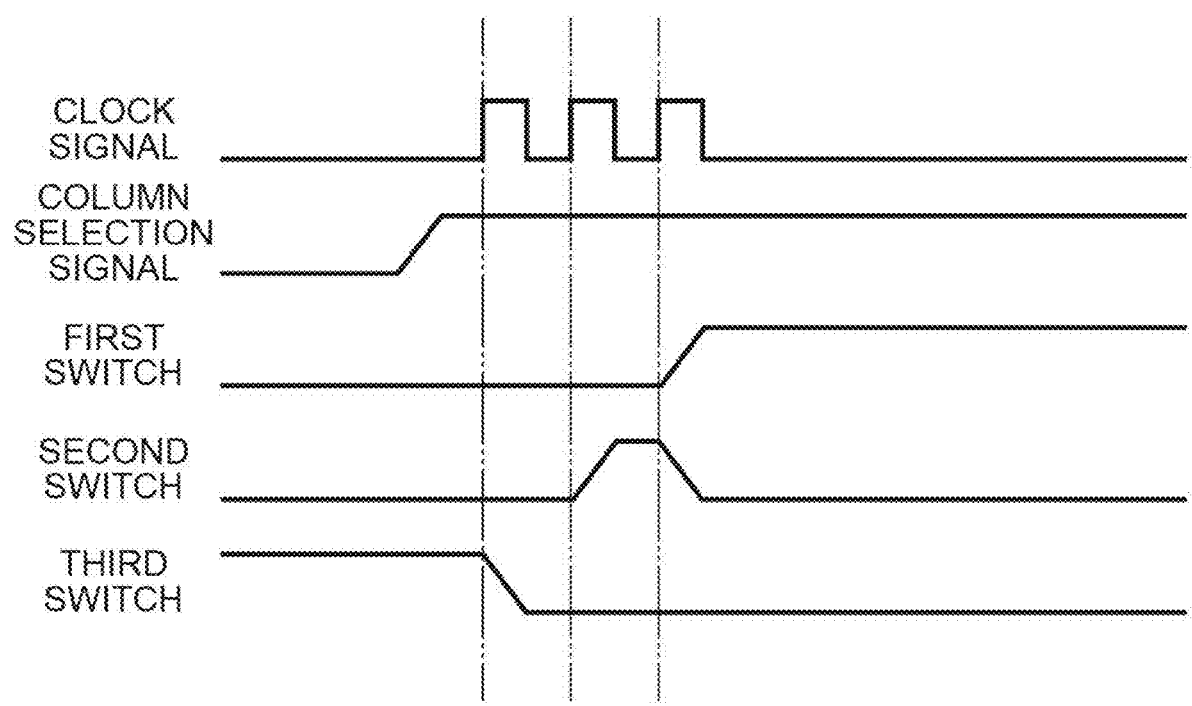
FIG. 10 is a timing chart of control signals that control the switch array.
Figure 11:
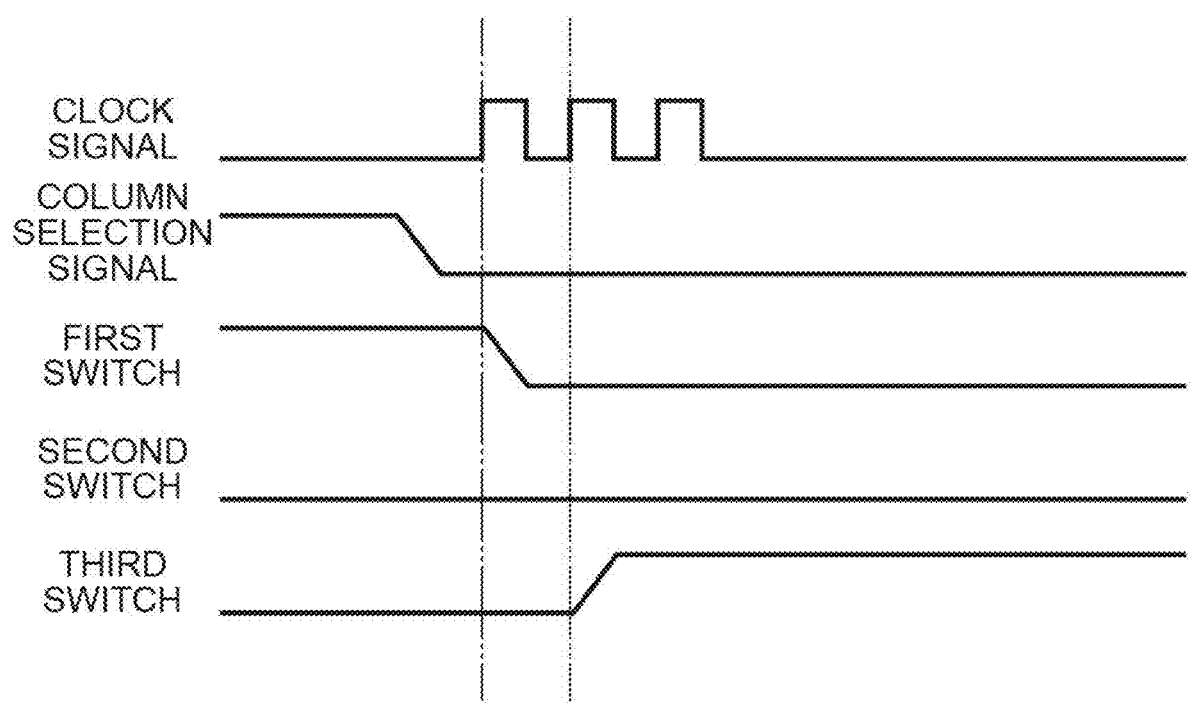
FIG. 11 is a timing chart of control signals that control the switch array.

Next, an example of operations of the switch array 7 and the switch controller 8 in this embodiment will be described in more detail with reference to FIGS. 10 and 11. FIGS. 10 and 11 are timing charts of control signals that control the switch array 7.

By controlling the MOS switch circuit 15 corresponding to each pixel G, the switch controller 8 sets an operating state of the pixel G arranged at a position where light is detected to a state in which a detection signal can be read, and sets operating states of the other pixels G to a state in which a detection signal cannot be read. The switch controller 8 sets a state in which a detection signal can be read from an APD 11 included in a pixel G disposed at a position where light is detected, and sets a state in which a signal cannot be read from APDs 11 included in the other pixels G. For example, in the configuration illustrated in FIG. 2, the light detection device 1 determines timing at which a detection signal from each pixel G can be read based on a radiation position at which the light projection unit 2 radiates the laser beam B1 and timing at which the light projection unit 2 radiates the laser beam B1. The light detection device 1 determines a state to be set for each of the plurality of pixels G for each signal output unit U. For example, the switch controller 8 performs a control operation to set one of the switches 21, 22, and 23 to a conductive state, and to set the others among the switches 21, 22, and 23 to a cutoff state.

For example, the terminals 24a of the switches 21, 22, and 23 are connected to the cathode of the APD 11 of the pixel G. The terminal 24b of the switch 21 is connected to the read line 10. A potential is applied to the terminal 24b of the switch 21 so that a voltage greater than or equal to the breakdown voltage is applied to the APD 11 when the switch 21 is in the conductive state. A potential based on a potential applied to the port 67 from the outside of the light reception unit 3 is applied to the terminal 24b of the switch 21. For example, when a potential of −50 V is applied to the anode of the APD 11 from the outside of the light reception unit 3 through the port 67, a potential of 0.6 V is applied to the terminal 24b of the switch 21.

The terminal 24b of the switch 22 is not connected to the read line 10. A potential is applied to the terminal 24b of the switch 22 so that a voltage greater than or equal to the breakdown voltage is applied to the APD 11 when the switch 22 is in the conductive state. A potential based on a potential applied to the port 67 from the outside of the light reception unit 3 is applied to the terminal 24b of the switch 22. For example, when a potential of −50 V is applied to the anode of the APD 11 from the outside of the light reception unit 3 through the port 67, a potential of 0.6 V is applied to the terminal 24b of the switch 22.

The terminal 24b of the switch 23 is not connected to the read line 10. A potential is applied to the terminal 24b of the switch 23 so that a voltage less than the breakdown voltage is applied to the APD 11 when the switch 23 is in the conductive state. A potential based on a potential applied to the port 67 from the outside of the light reception unit 3 is applied to the terminal 24b of the switch 23. For example, when a potential of −50 V is applied to the anode of the APD 11 from the outside of the light reception unit 3 through the port 67, a potential of −15 V is applied to the terminal 24b of the switch 23.

The switch controller 8 sets the switch 23 to the conductive state and sets the switch 21 and the switch 22 to the cutoff state while a detection signal cannot be read from the APD 11 included in the pixel G. In this case, it is possible to detect light incident on the pixel G. The switch controller 8 sets the switch 21 to the conductive state and sets the switches 22 and 23 to the cutoff state while a detection signal can be read from the APD 11 included in the pixel G. In this case, it is impossible to detect light incident on the pixel G. The switch controller 8 sets the switch 22 to the conductive state when switching the operating state of the pixel G.

For example, the switch controller 8 acquires information indicating setting to a state in which a detection signal from the pixel G can be read for each signal output unit U from another controller in the light detection device 1. For example, the switch controller 8 acquires a column selection signal illustrated in FIGS. 10 and 11 along with a clock signal.

When the column selection signal switches from Low to High, the switch controller 8 switches from a state in which a detection signal cannot be read from an APD 11 included in a signal output unit U corresponding to the column selection signal to a state in which a detection signal can be read from the APD 11 at timing based on a clock signal. When the column selection signal switches from Low to High, the switch controller 8 switches the states of the switches 21, 22, and 23 based on the clock signal. By switching the states of the switches 21, 22, and 23, the state in which the detection signal cannot be read from the APD 11 included in the signal output unit U corresponding to the column selection signal is switched to the state in which the detection signal can be read from the APD 11.

When the column selection signal switches from High to Low, the switch controller 8 switches from a state in which a detection signal can be read from an APD 11 included in a signal output unit U corresponding to the column selection signal to a state in which a detection signal cannot be read from the APD 11 at timing based on a clock signal. When the column selection signal switches from High to Low, the switch controller 8 switches the states of the switches 21, 22, and 23 based on the clock signal. By switching the states of the switches 21, 22, and 23, the state in which the detection signal can be read from the APD 11 included in the signal output unit U corresponding to the column selection signal is switched to the state in which the detection signal cannot be read from the APD 11.

First, a more detailed description will be given of an example of a flow when the state of the pixel G is switched from the state in which the detection signal cannot be read to the state in which the detection signal can be read with reference to FIG. 10. In other words, a description will be given of a flow of processing when switching from the state in which the detection signal cannot be read from the APD 11 included in the pixel G to the state in which the detection signal can be read from the APD 11 included in the pixel G. FIG. 10 is a timing chart of signals when the state of the pixel G is switched from the state in which the detection signal cannot be read from the pixel G to the state in which the detection signal can be read from the pixel G. When switching from the state in which the detection signal cannot be read from the APD 11 included in the pixel G to the state in which the detection signal can be read from the APD 11 included in the pixel G, the switch controller 8 performs a control operation so that the switch 23, the switch 22, and the switch 21 are set to conductive states in this order.

When the state of the pixel G is switched from the state in which the detection signal cannot be read to the state in which the detection signal can be read, the switch controller 8 executes a stage in which the switch 22 is set to the conductive state between a stage in which the switch 23 is set to the conductive state and a stage in which the switch 21 is set to the conductive state. In other words, when the state of the pixel G is switched from the state in which the detection signal cannot be read to the state in which the detection signal can be read, the switch controller 8 performs a control operation so that the switches 21, 22, and 23 are set to the conductive states in order of the switch 23, the switch 22, and the switch 21.

After the light detection device 1 starts to operate, the switch controller 8 maintains the switch 23 in the conductive state until a first rising edge of the clock signal is input. After the light detection device 1 starts to operate, the switch controller 8 maintains the switch 22 in the cutoff state until a second rising edge of the clock signal is input. After the light detection device 1 starts to operate, the switch controller 8 maintains the switch 21 in the cutoff state until a third rising edge of the clock signal is input. By maintaining the switch 23 in the conductive state until the first rising edge of the clock signal is input, a constant voltage is applied to the pixel G through the switch 23, thereby stabilizing the operating state of each APD 11. In this case, for example, when the switch 22 is set to the conductive state, a time required for each APD 11 to maintain a desired voltage greater than or equal to the breakdown voltage becomes stable.

The switch controller 8 instructs the switch 23 to switch from the conductive state to the cutoff state in response to the first rising edge of the clock signal after the column selection signal switches from Low to High. As a result, the cathode of the APD 11 switches from a state in which a potential of −15 V is applied to a floating state. At this stage, the APD 11 is not in a breakdown state.

Next, the switch controller 8 instructs the switch 22 to switch from the cutoff state to the conductive state in response to the second rising edge of the clock signal after the column selection signal switches from Low to High. As a result, the cathode of the APD 11 switches from a floating state to a state in which a potential of 0.6 V is applied. At this stage, the APD 11 is in a breakdown state and is not connected to the read line 10.

Next, the switch controller 8 instructs the switch 22 to switch from the conductive state to the cutoff state and instructs the switch 21 to switch from the cutoff state to the conductive state in response to the third rising edge of the clock signal after the column selection signal switches from Low to High. As a result, the cathode of the APD 11 switches from a state in which a potential of 0.6 V is applied and the cathode is not connected to the read line 10 to a state in which a potential of 0.6 V is applied and the cathode is connected to the read line 10. At this stage, the APD 11 is in a breakdown state and is connected to the read line 10.

As described above, in response to the second rising edge of the clock signal, the switch controller 8 instructs the switch 23 to switch from the conductive state to the cutoff state in response to the first rising edge of the clock signal, and instructs the switch 22 to switch from the cutoff state to the conductive state. A predetermined time elapses from the first rising edge of the clock signal to the second rising edge of the clock signal. Therefore, the switch controller 8 instructs that the state in which the detection signal cannot be read from the APD 11 included in the pixel G switch to the state in which the detection signal can be read from the APD 11, and then, after the predetermined time elapses, instructs the switch 22 to switch from the cutoff state to the conductive state.

In response to the third rising edge of the clock signal, the switch controller 8 instructs the switch 22 to switch from the conductive state to the cutoff state, and instructs the switch 21 to switch from the cutoff state to the conductive state. Therefore, when switching from the state in which the detection signal cannot be read from the APD 11 included in the pixel G to the state in which the detection signal can be read from the APD 11, the switch controller 8 instructs the switch 21 to switch from the cutoff state to the conductive state at the same timing as instructing the switch 22 to switch from the conductive state to the cutoff state.

Next, a more detailed description will be given of an example of a flow when the state of the pixel G is switched from the state in which the detection signal can be read to the state in which the detection signal cannot be read with reference to FIG. 11. In other words, a description will be given of a flow of processing when switching from the state in which the detection signal can be read from the APD 11 included in the pixel G to the state in which the detection signal cannot be read from the APD 11. FIG. 11 is a timing chart of signals when the state of the pixel G is switched from the state in which the detection signal can be read to the state in which the detection signal cannot be read.

When the state of the pixel G is switched from the state in which the detection signal not be read to the state in which the detection signal cannot be read, the switch controller 8 does not execute a stage in which the switch 22 is set to the conductive state between a stage in which the switch 21 is set to the conductive state and a stage in which the switch 23 is set to the conductive state. In other words, when the state of the pixel G is switched from the state in which the detection signal can be read to the state in which the detection signal cannot be read, the switch controller 8 performs a control operation so that the switches 21 and 23 are set to the conductive states in order of the switch 21 and the switch 23. In this instance, when a voltage less than the breakdown voltage is not applied to each APD 11 through the switch 23 after the switch 21 is set to the cutoff state, the breakdown state of each APD 11 is maintained. When a voltage less than the breakdown voltage is applied to each APD 11 through the switch 23 after the switch 21 is set to the cutoff state, a state in which the detection signal can be read is switched to a state in which the detection signal cannot be read at predetermined timing.

The switch controller 8 instructs the switch 21 to switch from the conductive state to the cutoff state in response to the first rising edge of the clock signal after the column selection signal switches from High to Low. As a result, a potential of 0.6 V is applied to the cathode of the APD 11, and the cathode is switched from a state of being connected to the read line 10 to a floating state. At this stage, the APD 11 and the read line 10 are disconnected.

Next, the switch controller 8 instructs the switch 22 to switch from the cutoff state to the conductive state in response to the second rising edge of the clock signal after the column selection signal switches from High to Low. As a result, the cathode of the APD 11 switches from the floating state to a state in which a potential of −15 V is applied thereto. At this stage, the APD 11 is not in the breakdown state. The switch controller 8 does not instruct the switches 21, 22, and 23 at the third rising edge of the clock signal after the column selection signal switches from High to Low.

Next, effects of the light detection device 1 will be described. A recharge current flows through the APD 11 when switching from a second state in which a voltage less than the breakdown voltage is applied to the APD 11 to a first state in which a voltage greater than or equal to the breakdown voltage is applied to the APD 11. The recharge current has a relatively large effect on an analog circuit. For example, the recharge current has a relatively large effect on a component provided before the comparator 27. For example, the recharge current has a relatively large effect on the buffer amplifier 26 of the front-end circuit 16. By suppressing this recharge current from flowing to the signal processor 9, robustness of the signal processor 9 is improved. In other words, robustness of the light detection device 1 is improved.

The MOS switch circuit 15 includes the switches 21, 22, and 23. The switches 21, 22, and 23 are connected in parallel to each other. The terminals 24*a* of the switches 21, 22, and 23 are connected to the terminal 11*b* of the APD 11. The terminal 24*b* of the switch 21 is connected to the read line 10. The terminals 24*b* of the switches 22 and 23 are not connected to the read line 10 and are electrically separated from each other.

According to such a configuration, when the switch 21 is set to the conductive state, a voltage greater than or equal to the breakdown voltage can be applied to the APD 11, and the terminal 11*b* of the APD 11 can be connected to the read line. When the switch 22 is set to the conductive state, a voltage greater than or equal to the breakdown voltage is applied to the APD 11 without connecting the terminal 11*b* of the APD 11 to the read line 10, and when the switch 23 is set to the conductive state, a voltage less than the breakdown voltage can be applied to the APD 11. As a result, when switching between a state in which a voltage greater than or equal to the breakdown voltage is applied to the APD 11 and a state in which a voltage less than the breakdown voltage is applied to the APD 11, a recharge current can be inhibited from flowing into the read line 10. That is, in a configuration in which the operating state of the pixel G can be switched, it is possible to inhibit the recharge current from flowing into the signal processor 9. Therefore, robustness of the light detection device 1 can be improved.

The light detection device 1 further includes the switch controller 8 that controls the switches 21, 22, and 23. The switch controller 8 performs a control operation to set one of the switches 21, 22, and 23 to the conductive state, and set the others among the switches 21, 22, and 23 to the cutoff state. In this case, a current is inhibited from flowing between different switches.

When switching from the state in which the detection signal cannot be read from the APD 11 included in the pixel G to the state in which the detection signal can be read from the APD 11, the switch controller 8 performs a control operation so that the switch 23, the switch 22, and the switch 21 are set to the conductive states in this order. In this case, a recharge current can be more reliably inhibited from flowing into the signal processor 9.

When switching from the state in which the detection signal cannot be read from the APD 11 included in the pixel G to the state in which the detection signal can be read from the APD 11, the switch controller 8 instructs the switch 23 to switch from the conductive state to the cutoff state, and then, after a predetermined time elapses, instructs the switch 22 to switch from the cutoff state to the conductive state. In this case, a current can be more reliably inhibited from flowing from the terminal 24b of the switch 23 to the terminal 24b of the switch 22.

When switching from the state in which the detection signal cannot be read from the APD 11 included in the pixel G to the state in which the detection signal can be read from the APD 11, the switch controller 8 instructs the switch 22 to switch from the conductive state to the cutoff state, and instructs the switch 21 to switch from the cutoff state to the conductive state at the same time. In this case, the APD 11 is inhibited from being in a floating state, and a voltage greater than or equal to the breakdown voltage can be stably applied to the APD 11.

A potential applied to the terminal 24b of the switch 22 is the same as a potential applied to the terminal 24b of the switch 21. In this case, the APD 11 can be connected to the read line 10 in a more stable state.

The light detection device 1 includes at least one control line 20a, at least one control line 20b, and at least one control line 20c. The at least one control line 20a delivers a control signal to the switch 21. The at least one control line 20b delivers a control signal to the switch 22. The at least one control line 20c delivers a control signal to the switch 23. Each of the plurality of MOS switch circuits 15 includes the switch 21, the switch 22, and the switch 23. The plurality of APDs 11 is included in a plurality of pixels G. The plurality of pixels G and the plurality of MOS switch circuits 15 are included in the plurality of signal output units U. Each of the plurality of signal output units U includes a plurality of pixels G and a plurality of MOS switch circuits 15, and outputs a signal from the pixel G through the MOS switch circuit 15. A plurality of switches 21 included in the same signal output unit U is connected to the same control line 20a. A plurality of switches 22 included in the same signal output unit U is connected to the same control line 20b. A plurality of switches 23 included in the same signal output unit U is connected to the same control line 20c. In this case, in the same signal output unit U, operating states of a plurality of pixels G connected to a plurality of MOS switch circuits 15 can be switched at once.

A plurality of switches 21 included in mutually different signal output units U is connected to mutually different control lines 20a. A plurality of switches 22 included in mutually different signal output units U is connected to mutually different control lines 20b. A plurality of switches 23 included in mutually different signal output units U is connected to mutually different control lines 20c. In this case, operating states of a plurality of pixels G connected to a plurality of MOS switch circuits 15 can be switched at once for each signal output unit U.

A plurality of MOS switch circuits 15 connected to the same control line among the control lines 20a, 20b, and 20c is arranged in a line. It is possible to switch operating states of a plurality of pixels G connected to a plurality of MOS switch circuits 15 at once for each column.

The plurality of MOS switch circuits 15 is arranged in a matrix when viewed from the Z-axis direction. The circuit board 50 further includes a plurality of read lines 10 that electrically connects corresponding MOS switch circuits 15 among the plurality of MOS switch circuits 15 and the signal processor 9 that processes signals from the APD 11. A plurality of MOS switch circuits 15 included in mutually different signal output units U and arranged in a line is connected to the same read line 10. In this case, the number of read lines 10 and the number of signal processors 9 can be reduced. A balance is achieved between reducing the time required for signal processing and making the light detection device 1 more compact.

The light detection device 1 includes a plurality of signal processors 9 that performs processes in parallel with each other in terms of time. The plurality of signal processors 9 is connected to mutually different read lines 10. In this case, a balance is achieved between reducing the time required for signal processing and making the light detection device more compact.

The light detection device 1 includes a MOS switch circuit 15. This MOS switch circuit 15 can switch the operating states of the plurality of pixels G. For example, a voltage greater than or equal to the breakdown voltage is applied to an APD 11 of a pixel G on which detection light is incident, and a voltage less than the breakdown voltage is applied to the APDs 11 of the other pixels G. As a result, heat generation of the APD due to incidence of light other than detection light can be suppressed. In the light detection device 1, when viewed from the Z-axis direction perpendicular to the incident surface S, the area of the MOS switch circuit region β electrically connected to each pixel G is greater than the area of one light receiving region R, and the MOS switch circuit region β overlaps with a plurality of light receiving regions R. In this case, a space is ensured to dispose the MOS switch circuit 15 that can withstand an increase in overvoltage, and the PDE of the APD 11 can be improved by improving the overvoltage.

Each pixel G includes a plurality of APDs 11 electrically connected in parallel to each other and each connected to the same MOS switch circuit 15. For this reason, in response to switching of the MOS switch circuit 15, detection signals from the plurality of APDs 11 of each pixel G are summed and output. Therefore, as illustrated in FIG. 5, strength of the detection signal DS changes depending on the incident light. In this case, by determining whether strength of the detection signal DS is greater than the threshold TH using the functional unit 17, etc., it is possible to determine whether light incident on the pixel G is only the disturbance light B3. In this way, and even in a configuration in which an aperture ratio is ensured, an influence of disturbance light can be suppressed. Therefore, when the light detection device 1 is configured to be able to switch the operating state of the pixel G, accuracy of light detection can be further improved. When viewed from the Z-axis direction, the area of the MOS switch circuit region β is less than or equal to the area of the pixel area α.

According to the above configuration, the MOS switch circuit 15 is disposed by effectively utilizing a space overlapping with an area where the plurality of APDs 11 included in each pixel G is disposed. A space is ensured to disposed a MOS switch circuit 15 that can withstand an increase in overvoltage, and the PDE of the APD 11 can be improved. Furthermore, detection light and disturbance light can be distinguished from each other, and an influence of disturbance light can be suppressed. Therefore, the influence of disturbance light can be suppressed while achieving both ensuring of resolution of light detection and improvement of the PDE of the APD 11. That is, accuracy of light detection can be further improved. Therefore, when the light detection device 1 is configured to be able to switch the operating state of the pixel G, accuracy of light detection can be further improved.

Figure 12:
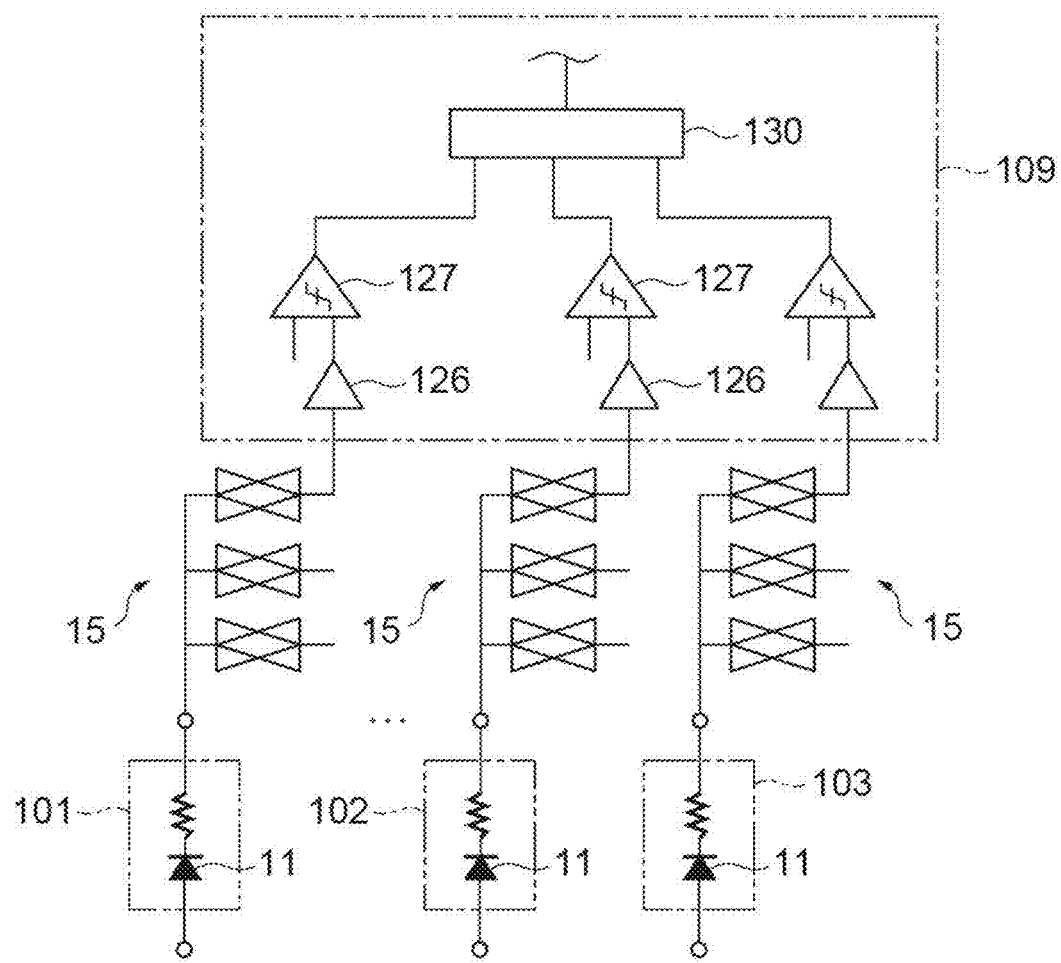
FIG. 12 is a diagram for describing a light detector and a switch array in a light detection device of a comparative example.
Figure 13:
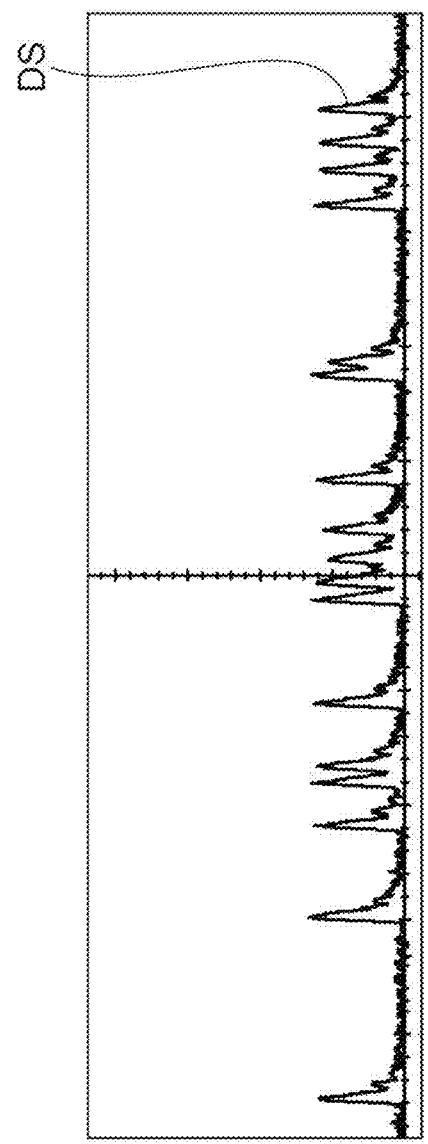
FIG. 13 is a diagram illustrating a detection signal detected by the light detection device of the comparative example.

FIG. 12, FIG. 13, FIG. 14(a), and FIG. 14(b) are diagrams for describing a comparative example of the light detection device 1. As illustrated in FIG. 12, when each of the pixels 101, 102, and 103 includes only one APD 11 in two dimensions when viewed from the Z-axis direction, an MOS switch circuit 15 is connected to the APD 11 of each of the pixels 101, 102, and 103. In other words, different MOS switch circuits 15 are connected to a plurality of APDs 11. In this configuration, a detection signal DS having a waveform illustrated in FIG. 13 is output. There is no difference between the case where detection light is incident and the case where disturbance light is incident, and a detection signal having a constant peak value is output depending on the incidence of light. In this case, in order to reduce an influence of disturbance light incident on the light receiving region, it is conceivable to distinguish between the detection light and the disturbance light by comparing detection results of pixels disposed at different positions.

Figure 14:
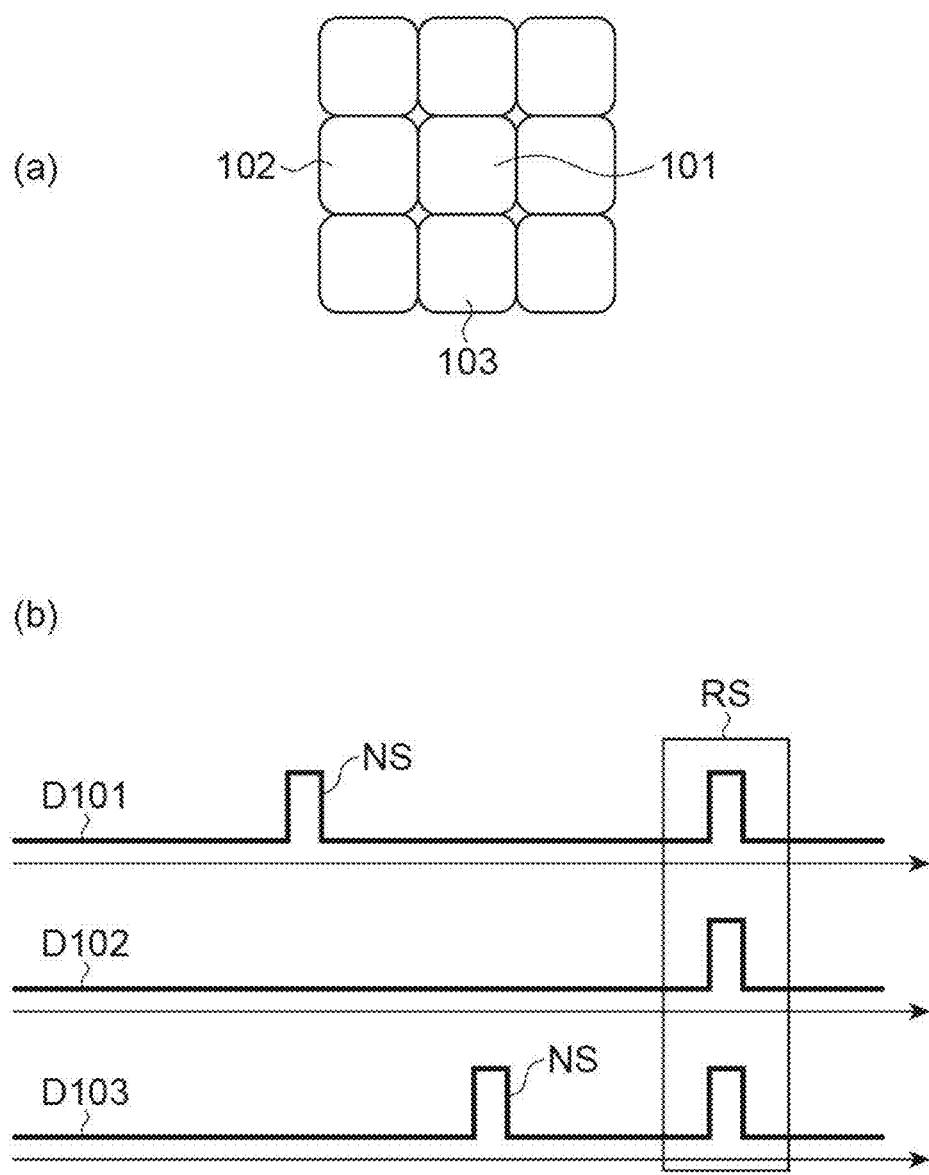
FIG. 14(a) is a diagram illustrating a pixel configuration of the comparative example.
FIG. 14(b) is a diagram illustrating detection signals of the comparative example.

For example, when a plurality of pixels 101, 102, and 103 is two-dimensionally arranged when viewed from the Z-axis direction as illustrated in FIG. 14(a), the detection signal of the pixels 101, 102, and 103 are simultaneously acquired, and detection light and disturbance light are distinguished based thereon. Data D101, D102, and D103 illustrated in FIG. 14(b) is signal data obtained by digitizing detection signals output from the pixels 101, 102, and 103, respectively. A signal RS is illustrated in any one of the data D101, the data D102, and the data D103. A signal NS is illustrated in each of the data D101 and the data D103. In this case, the signal RS is generated at the same timing, whereas the signal NS is generated at different timing from other signals. Therefore, by comparing detection signals output from mutually different pixels 101, 102, and 103, the signal RS can be determined to be the timing at which detection light is incident, and the signal NS can be determined to be noise caused by incidence of disturbance light, etc.

However, in this configuration, a plurality of pixels is used to detect light incident on one pixel in order to distinguish between detection light and disturbance light. Mutually different MOS switch circuits 15 are connected to these pixels. Therefore, it is difficult to achieve both ensuring of resolution of light detection and ensuring of a space to dispose the MOS switch circuits 15. As a size of the MOS switch circuit 15 connected to the APD 11 of each pixel increases, resolution decreases. As the number of pixels to be compared increases, resolution decreases. On the other hand, according to the light detection device 1, it is possible to suppress the influence of disturbance light, ensure resolution of light detection, ensure a space to dispose the MOS switch circuit 15 that can withstand an increase in overvoltage, and suppress the calculation load. Furthermore, according to the light detection device 1, a dynamic range can be improved.

In the light detection device 1, the area of the MOS switch circuit region β is greater than the square of the pitch W3 of the plurality of APDs 11 included in the pixel when viewed from the Z-axis direction. In this case, a space can be more reliably ensured to dispose the MOS switch circuit 15.

In the light detection device 1, in each pixel G, the plurality of APDs 11 is two-dimensionally arranged in the X-axis direction and the Y-axis direction. When viewed from the Z-axis direction, the area of the MOS switch circuit region β may be greater than the product of the pitch W3 of the plurality of APDs 11 in the Y-axis direction and the pitch W3 of the plurality of APDs 11 in the X-axis direction. In this case, a space can be more reliably ensured to dispose the MOS switch circuit 15.

In the light detection device 1, the MOS switch circuit region β is located inside the pixel area α of the pixel G connected to the MOS switch circuit 15 of the MOS switch circuit region β when viewed from the Z-axis direction. In this case, further compactness of the light detection device 1 can be achieved.

The pitch W2 of the pixels in at least one of the X-axis direction and the Y-axis direction is greater than twice a maximum diameter of the light receiving region R when viewed from the Z-axis direction. In this case, the pixel pitch is ensured, and the MOS switch circuit region β in which the MOS switch circuit 15 is arranged is more reliably ensured.

The MOS switch circuit 15 and the plurality of APDs 11 included in the pixel G connected to the MOS switch circuit 15 are electrically connected to each other through the bump electrode B disposed between the light detection board 40 and the circuit board 50. The bump electrode B is disposed in the light receiving region R of one of the plurality of APDs 11 connected to the bump electrode B when viewed from a direction perpendicular to the main surface 40a. In this case, when viewed from the direction perpendicular to the main surface 40a, the light receiving region R is greater than the bump electrode B, and the MOS switch circuit region β is even greater than the light receiving region R. Therefore, the MOS switch circuit region β in which the MOS switch circuit 15 is disposed can be more reliably ensured.

When viewed from the Z-axis direction, the area of the light receiving region R is 5 $\mu m^2$ or more and 650 $\mu m^2$ or less. When viewed from the Z-axis direction, the area of the MOS switch circuit region β is greater than the area of the light receiving region R. Therefore, the MOS switch circuit region β in which the MOS switch circuit 15 is disposed can be more reliably ensured.

The MOS switch circuit 15 includes a plurality of MOSFETs connected in parallel to each other. In this case, the operating state of the pixel G connected to the MOS switch circuit 15 can be switched.

Even though the embodiments and modifications of the invention have been described above, the invention is not necessarily limited to the above-described embodiments, and various changes can be made without departing from the gist thereof.

Figure 15:
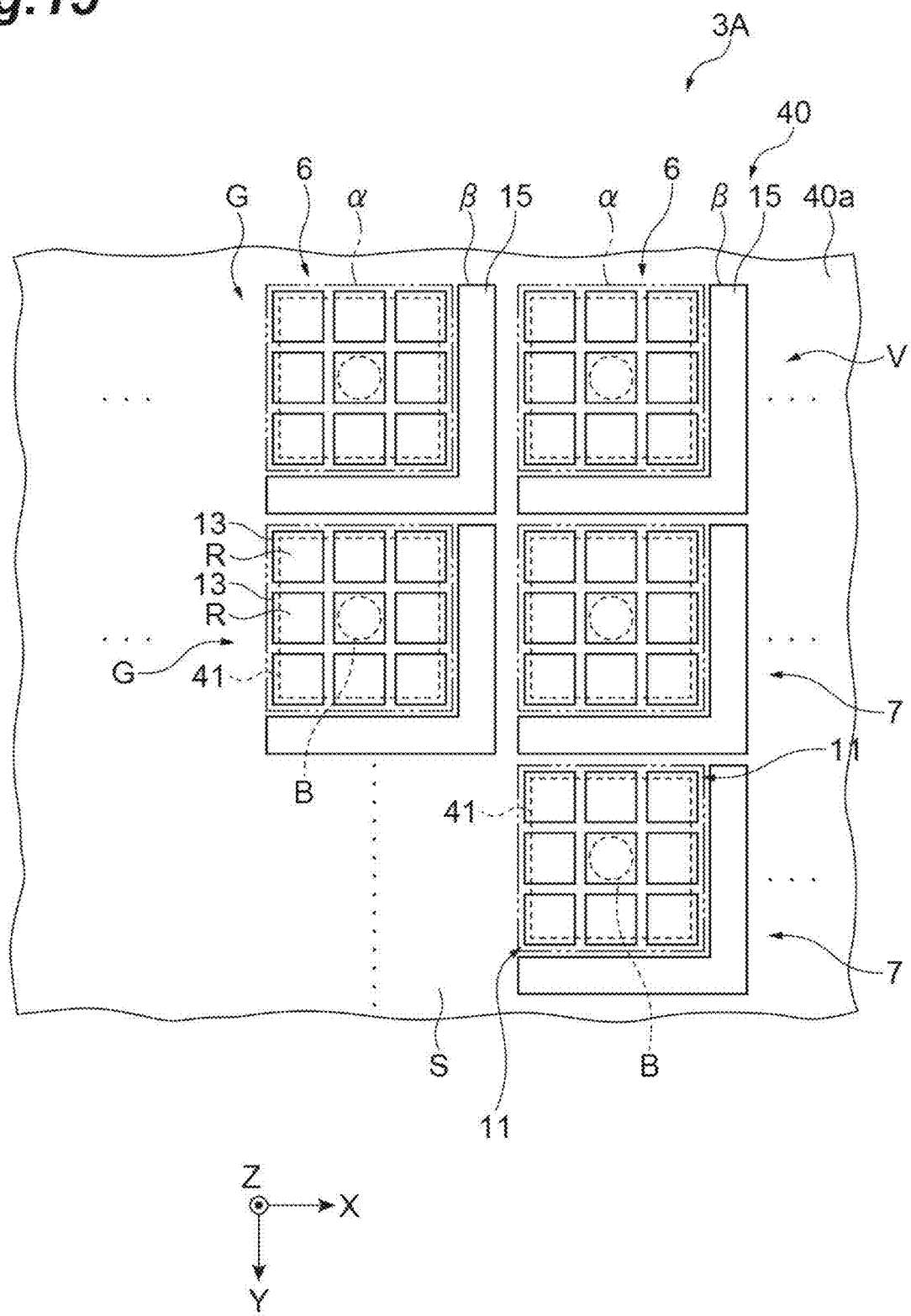
FIG. 15 is a partially enlarged view of a light reception unit in a modification of this embodiment.

For example, the light detection board 40 may include not only the light detector 6 but also the switch array 7. In other words, the switch array 7 may be included in the light detection board 40 instead of the circuit board 50. For example, as illustrated in FIG. 15, the switch array 7 may be disposed around each pixel G. FIG. 15 is a partially enlarged view of a light reception unit 3A in a modification of this embodiment.

In the light reception unit 3A, each pixel G and the MOS switch circuit 15 corresponding to the pixel G are disposed in one rectangular area when viewed from the Z-axis direction. When viewed from the Z-axis direction, sets of mutually corresponding pixels G and MOS switch circuits 15 are two-dimensionally arranged in the XY-axis direction on the light detection board 40.

In light reception unit 3A, each MOS switch circuit region β has an L-shape. Each MOS switch circuit region β is located along the edge of the pixel area α of the corresponding pixel G among the plurality of pixels G when viewed from the Z-axis direction. When viewed from the Z-axis direction, each MOS switch circuit region β is located along the edge of the pixel area α of the pixel G connected to the MOS switch circuit 15 of the MOS switch circuit region β. The plurality of pixel areas α and the plurality of MOS switch circuit regions β do not overlap. Each MOS switch circuit region β may have a rectangular shape. Each MOS switch circuit region β may be disposed to surround the pixel area α of the corresponding pixel G among the plurality of pixels G.

The light detection device 1 is not limited to a LiDAR. The light detection device 1 does not need to include the light projection unit 2. The light detection device 1 may include only the light reception unit 3. The light reception unit 3 may be used for a device other than the LiDAR.

In this embodiment, the switch array 7, the switch controller 8, and the signal processor 9 are included in one circuit board 50. However, the switch array 7, the switch controller 8, and the signal processor 9 may be included in different boards. In this case, mutually different boards may be connected by wire bonding. The switch array 7 may be included in the circuit board 50, and the switch controller 8 and the signal processor 9 may be included in a different board from the circuit board 50. The switch array 7 and the switch controller 8 may be included in the circuit board 50, and the signal processor 9 may be included in a different board from the circuit board 50.

As in the modification illustrated in FIG. 15, when the switch array 7 is included in the light detection board 40, the switch controller 8 and the signal processor 9 may also be included in the light detection board 40, and the switch controller 8 and the signal processor 9 may be included in a different board from the light detection board 40. The switch controller 8 may be included in the light detection board 40, and the signal processor 9 may be included in a different board from the light detection board 40.

In the embodiments and modifications described above, a description has been given of the case in which the light reception units 3 and 3A are back-illuminated semiconductor detection devices. However, the light reception units 3 and 3A may be front-illuminated semiconductor detection devices.

In the embodiments and modifications described above, a description has been given of the case in which each pixel G includes a plurality of APDs 11 connected in parallel to each other, and the pixel G and the MOS switch circuit 15 are connected on a one-to-one basis. However, a configuration in which a plurality of switches 21, 22, and 23 is connected to each pixel is not limited thereto. Even in a configuration in which each pixel includes only one APD and the pixel and the MOS switch circuit 15 are connected on a one-to-one basis, a charge current can be inhibited from flowing into the signal processor 9.

In the embodiments described above, even though a configuration in which a plurality of bump electrodes B is formed between the light detection board 40 and the circuit board 50 has been described, the invention is not limited to this configuration. For example, the light detection board 40 and the circuit board 50 may be joined so as to be in contact with each other.

REFERENCE SIGNS LIST

1: light detection device, 8: switch controller, 9: signal processor, 10: read line, 11: avalanche photodiode, 15: MOS switch circuit, 21, 22, 23: switch, 24a, 24b: terminal, 40: light detection board, 40a: main surface, 50: circuit board, G: pixel, DS: signal, R: light receiving region, α: pixel area, β: MOS switch circuit region.

The invention claimed is:
1. A light detection device comprising:
at least one avalanche photodiode forming a light receiving region and configured to operate in a Geiger mode;
at least one switch circuit including first, second, and third switches connected in parallel to each other; and
a read line electrically connecting the first switch and a signal processor configured to process a signal from the avalanche photodiode to each other, wherein:
each of the first, second, and third switches includes a first terminal connected to the avalanche photodiode, and a second terminal different from the first terminal, and is configured to switch between a conductive state in which the first terminal and the second terminal are conductive and a cutoff state in which the first terminal and the second terminal are electrically cut off,
the first switch is configured such that a voltage greater than or equal to a breakdown voltage is applied to the avalanche photodiode in the conductive state, and the second terminal of the first switch is connected to the read line,
the second switch is configured such that a voltage greater than or equal to a breakdown voltage is applied to the avalanche photodiode in the conductive state, and the second terminal of the second switch is not connected to the read line, and
the third switch is configured such that a voltage less than a breakdown voltage is applied to the avalanche photodiode in the conductive state and the second terminal of the third switch is not connected to the read line.

2. The light detection device according to claim 1, further comprising a switch controller configured to perform a control operation of the first, second, and third switches,
wherein the switch controller performs the control operation to set any one of the first, second, and third switches to the conductive state, and to set the other switches among the first, second, and third switches to the cutoff state.

3. The light detection device according to claim 2, wherein, when switching from a state in which a detection signal is not allowed to be read from the avalanche photodiode to a state in which a detection signal is allowed to be read from the avalanche photodiode, the switch controller performs the control operation so that the third switch, the second switch, and the first switch are in the conductive state in this order.

4. The light detection device according to claim 2, wherein, when switching from a state in which a detection signal is not allowed to be read from the avalanche photodiode to a state in which a detection signal is allowed to be read from the avalanche photodiode, the switch controller instructs the third switch to switch from the conductive state to the cutoff state, and then, after a predetermined time elapses, instructs the second switch to switch from the cutoff state to the conductive state.

5. The light detection device according to claim 2, wherein, when switching from a state in which a detection signal is not allowed to be read from the avalanche photodiode to a state in which a detection signal is allowed to be read from the avalanche photodiode, the switch controller instructs the first switch to switch from the cutoff state to the conductive state at the same timing as instructing the second switch to switch from the conductive state to the cutoff state.

6. The light detection device according to claim 1, wherein a potential applied to the second terminal of the second switch is the same as a potential applied to the second terminal of the first switch.

7. The light detection device according to claim 1, further comprising:
at least one first control line configured to deliver a control signal to the first switch;

at least one second control line configured to deliver a control signal to the second switch; and at least one third control line configured to deliver a control signal to the third switch, wherein:

the at least one avalanche photodiode includes a plurality of avalanche photodiodes, the at least one switch circuit includes a plurality of switch circuits each including the first switch, the second switch, and the third switch, the plurality of avalanche photodiodes is included in a plurality of pixels, the plurality of pixels and the plurality of switch circuits each include a plurality of pixels and a plurality of switch circuits, and are included in a plurality of signal output units configured to output signals from the pixels through the switch circuits, a plurality of first switches included in the same signal output unit is connected to the same first control line, a plurality of second switches included in the same signal output unit is connected to the same second control line, and a plurality of third switches included in the same signal output unit is connected to the same third control line.

8. The light detection device according to claim 7, wherein:

a plurality of first switches included in mutually different signal output units is connected to mutually different first control lines, a plurality of second switches included in mutually different signal output units is connected to mutually different second control lines, and a plurality of third switches included in mutually different signal output units is connected to mutually different third control lines.

9. The light detection device according to claim 7, wherein the plurality of switch circuits connected to the same first control line, the same second control line, and the same third control line are arranged in a line.

10. The light detection device according to claim 7, wherein:

the plurality of switch circuits is arranged in a matrix, and a plurality of switch circuits included in mutually different signal output units and arranged in a line is connected to the same read line.

11. The light detection device according to claim 7, further comprising a plurality of signal processors configured to perform processes in parallel with each other in terms of time, wherein the plurality of signal processors is connected to mutually different read lines.

12. A light detection device comprising:

at least one avalanche photodiode forming a light receiving region and configured to operate in a Geiger mode;

at least one switch circuit including first, second, and third switches connected in parallel to each other and each connected to a terminal of the avalanche photodiode; and a read line electrically connecting the first switch and a signal processor configured to process a signal from the avalanche photodiode to each other, wherein:

each of the first, second, and third switches includes a first terminal connected to the avalanche photodiode, and a second terminal different from the first terminal, and is configured to switch between a conductive state in which the first terminal and the second terminal are conductive and a cutoff state in which the first terminal and the second terminal are electrically cut off, the second terminal of the first switch is connected to the read line, and the second terminals of the second and third switches are not connected to the read line and are electrically separated from each other.

\* \* \* \* \*